United States Patent
Choi

(10) Patent No.: US 10,622,088 B2
(45) Date of Patent: Apr. 14, 2020

(54) STACKED MEMORY DEVICES, MEMORY SYSTEMS AND METHODS OF OPERATING STACKED MEMORY DEVICES

(71) Applicant: Samsung Electronics Co., Ltd., Suwon-si, Gyeonggi-do (KR)

(72) Inventor: Ahn Choi, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/245,724

(22) Filed: Jan. 11, 2019

(65) Prior Publication Data
US 2020/0027521 A1 Jan. 23, 2020

(30) Foreign Application Priority Data
Jul. 23, 2018 (KR) .................. 10-2018-0085119

(51) Int. Cl.
| | |
|---|---|
| *G11C 29/44* | (2006.01) |
| *G11C 8/14* | (2006.01) |
| *G11C 29/42* | (2006.01) |
| *G11C 11/4097* | (2006.01) |
| *G11C 17/16* | (2006.01) |
| *H01L 27/115* | (2017.01) |
| *G11C 7/22* | (2006.01) |
| *G11C 5/02* | (2006.01) |
| *H01L 23/538* | (2006.01) |
| *G11C 7/18* | (2006.01) |

(52) U.S. Cl.
CPC .......... *G11C 29/4401* (2013.01); *G11C 5/025* (2013.01); *G11C 7/18* (2013.01); *G11C 7/22* (2013.01); *G11C 8/14* (2013.01); *G11C 11/4097* (2013.01); *G11C 17/165* (2013.01); *G11C 29/42* (2013.01); *H01L 23/5384* (2013.01); *H01L 27/115* (2013.01)

(58) Field of Classification Search
CPC .................................. G11C 8/10; G11C 29/08
USPC ............................................ 365/201, 230.06
See application file for complete search history.

(56) References Cited

U.S. PATENT DOCUMENTS

| | | | |
|---|---|---|---|
| 7,859,925 B1 | 12/2010 | Stansell | |
| 8,982,598 B2 | 3/2015 | Franzon et al. | |
| 9,111,587 B2 | 8/2015 | Ware et al. | |
| 9,158,619 B2 | 10/2015 | Kobla et al. | |

(Continued)

FOREIGN PATENT DOCUMENTS

KR     10-1810771 B1     1/2018

*Primary Examiner* — Michael T Tran
(74) *Attorney, Agent, or Firm* — Harness, Dickey & Pierce, P.L.C.

(57) ABSTRACT

A stacked memory device includes a buffer die, a plurality of memory dies stacked on the buffer die and a plurality of through silicon vias (TSVs). The buffer die communicates with an external device. The TSVs extend through the plurality of memory dies to connect to the buffer die. Each of memory dies includes a memory cell array which includes a plurality of dynamic memory cells coupled to a plurality of word-lines and a plurality of bit-lines. The buffer die includes a test circuit, and the test circuit, in a test mode, performs a test on the dynamic memory cells of a target memory die corresponding to one of the memory dies and store, an address of a memory cell row including at least one defective cell, in at least one column decoder of other memory dies of except the target memory die.

20 Claims, 18 Drawing Sheets

(56) References Cited

U.S. PATENT DOCUMENTS

| | | | |
|---|---|---|---|
| 9,190,164 B1* | 11/2015 | Kim | G11C 16/26 |
| 9,659,669 B2 | 5/2017 | Sohn et al. | |
| 10,162,005 B1* | 12/2018 | Alzheimer | G01R 31/318547 |
| 2009/0193302 A1* | 7/2009 | Bingo | G11C 29/40 |
| | | | 714/718 |
| 2011/0002169 A1* | 1/2011 | Li | G11C 29/808 |
| | | | 365/185.09 |
| 2011/0302469 A1* | 12/2011 | Komai | G11C 29/52 |
| | | | 714/718 |
| 2012/0036404 A1* | 2/2012 | Tabata | G11C 29/56 |
| | | | 714/722 |
| 2013/0070545 A1* | 3/2013 | Anzou | G11C 29/26 |
| | | | 365/200 |
| 2013/0227344 A1* | 8/2013 | Sohn | G06F 11/27 |
| | | | 714/6.21 |
| 2014/0126302 A1* | 5/2014 | Yoon | G11C 29/40 |
| | | | 365/189.04 |
| 2014/0189332 A1* | 7/2014 | Ben-Kiki | G06F 9/30145 |
| | | | 712/244 |
| 2015/0063039 A1 | 3/2015 | Chen et al. | |
| 2015/0199234 A1* | 7/2015 | Choi | G11C 29/42 |
| | | | 714/764 |
| 2015/0348633 A1* | 12/2015 | Song | G11C 16/12 |
| | | | 365/185.19 |
| 2017/0132072 A1* | 5/2017 | Park | G06F 11/1044 |
| 2017/0365356 A1 | 12/2017 | Shibata et al. | |
| 2019/0130993 A1* | 5/2019 | Kim | G11C 29/781 |
| 2019/0294368 A1* | 9/2019 | Hiraishi | G06F 3/0679 |

\* cited by examiner

STACKED MEMORY DEVICES, MEMORY SYSTEMS AND METHODS OF OPERATING STACKED MEMORY DEVICES

CROSS-REFERENCE TO RELATED APPLICATIONS

This U.S. non-provisional application claims the benefit of priority under 35 USC § 119 to Korean Patent Application No. 10-2018-0085119, filed on Jul. 23, 2018, in the Korean Intellectual Property Office (KIPO), the disclosure of which is incorporated by reference in its entirety herein.

BACKGROUND

Various example embodiments of the inventive concepts relate to memories (e.g., memory devices, memory chips, etc.), and more particularly to stacked memory devices, memory systems, and/or methods of operating stacked memory devices.

Both the capacity and speed of a semiconductor memory, which may be used as a storage device in most recent electronic devices, are increasing. Furthermore, various attempts are being made to mount a memory with a larger capacity within a smaller space and efficiently operate the memory.

Recently, in order to increase the integration of a semiconductor memory, a 3-dimensional (3D) structure including a plurality of stacked memory chips has been applied instead of a 2-dimensional (2D) memory structure. Based on the demand for large integration and large capacity memories, a structure that employs a 3D stacked structure of the memory chips for increasing the capacity of a memory, increasing integration by reducing the size of a semiconductor chip, and reducing cost for manufacturing the same has been developed.

SUMMARY

One or more example embodiments may provide a stacked memory device capable of increasing storage space to store fail addresses (e.g., failed memory addresses).

One or more example embodiments may provide a memory system that includes a stacked memory device capable of increasing the storage space to store fail addresses.

One or more example embodiments may provide a method of operating a stacked memory device capable of increasing the storage space to store fail addresses.

According to one or more example embodiments, a stacked memory device includes a buffer die configured to communicate with at least one external device, the buffer die including a test circuit, a plurality of memory dies stacked on the buffer die, each of the plurality of memory dies including a memory cell array, the memory cell array including a plurality of dynamic memory cells coupled to a plurality of word-lines and a plurality of bit-lines, a plurality of through silicon vias (TSVs) extending through the plurality of memory dies and connected to the buffer die, and the test circuit, during a test mode of the stacked memory device, is configured to perform a test on the dynamic memory cells of a target memory die corresponding to at least one of the plurality of memory dies, the test to detect at least one defective cell of the target memory die, and store, as fail address information, an address of a memory cell row including the at least one defective cell detected through the test, in at least one column decoder of another memory die of the plurality of memory dies, the another memory die not being the target memory die.

According to one or more example embodiments, a memory system includes a memory controller configured to control the stacked memory device, and the stacked memory device, the stacked memory device including a buffer die configured to communicate with the memory controller, the buffer die including a test circuit, a plurality of memory dies stacked on the buffer die, each of the plurality of memory dies including a memory cell array, the memory cell array including a plurality of dynamic memory cells coupled to a plurality of word-lines and a plurality of bit-lines, a plurality of through silicon vias (TSVs) extending through the plurality of memory dies to connect to the buffer die, and the test circuit, during a test mode of the stacked memory device is configured to in response to test command or a test mode register set (TMRS) from the memory controller, perform a test on the dynamic memory cells of a target memory die corresponding to at least one of the plurality of memory dies, the test to detect at least one defective cell of the target memory die, and store, as fail address information, an address of a memory cell row including the at least one defective cell detected through the test, in at least one column decoder of another memory die of the plurality of memory dies, the another memory die not being the target memory die.

According to one or more example embodiments, in a method of operating a stacked memory device, the stacked memory device including a buffer die to communicate with at least one external device, a plurality of memory dies stacked on the buffer die and a plurality of through silicon vias (TSVs) extending through the plurality of memory dies to connect to the buffer die, the method including performing a test on dynamic memory cells of a target memory die corresponding to one of the plurality of memory dies, the test to detect at least one defective cell of the target memory die, temporarily storing a fail address in a column decoder of the target memory die based on results of the test of the target memory die, storing the fail address in at least one column decoder of another memory die of the plurality of memory dies, the another memory die not being the target memory die, and transmitting the fail address to the external device from the at least one column decoder of the another memory die through a data input/output path of the stacked memory device.

Accordingly, the memory device may include a buffer die and a plurality of memory dies and may store fail addresses detected in a target memory die in column decoders of other memory dies through TSVs instead of the target memory die in a test mode. Therefore, the stacked memory device may increase storage space to store the fail addresses and thus may increase usability of the stacked memory device 910 in the test mode.

BRIEF DESCRIPTION OF THE DRAWINGS

Example embodiments will be described below in more detail with reference to the accompanying drawings.

DETAILED DESCRIPTION

Various example embodiments will be described more fully hereinafter with reference to the accompanying drawings, in which example embodiments are shown.

Figure 1:
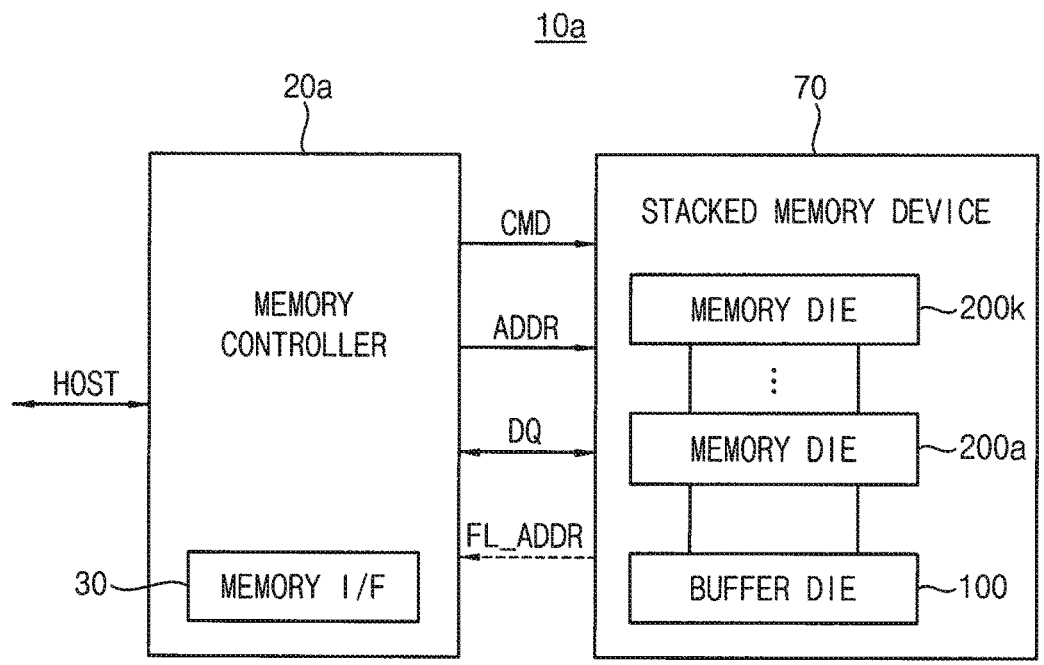
FIG. 1 is a block diagram illustrating a memory system according to at least one example embodiment.

FIG. 1 is a block diagram illustrating a memory system according to At least one example embodiment.

Referring to FIG. 1, a memory system 10a may include at least one memory controller 20a and/or at least one stacked memory device 70, but the example embodiments are not limited thereto.

The memory controller 20a may include a memory interface 30, and may control memory operations such as write, read, and the like, by providing various types of signals to the stacked memory device 70 through the memory interface 30. For example, the memory controller 20a accesses data DQ stored in the stacked memory device 70 by providing a command CMD and/or an address ADD to the stacked memory device 70, etc.

The memory controller 20a may access the stacked memory device 70 according to a request from a host. The memory controller 20a may communicate with the host using various communication protocols.

The stacked memory device 70 may include a buffer die 100 and/or a plurality of memory dies 200a~200k, where k is an integer greater than two, etc. The buffer die 100 and the memory dies 200a~200k may be sequentially stacked on each other (e.g., three-dimensionally stacked on each other). The memory dies 200a~200k stacked on the buffer die 100 may be electrically connected to the buffer die 100 through conducting means (e.g., electrical connections, etc.). The conducting means may be one or more through silicon via TSVs, but the example embodiments are not limited thereto.

The buffer die 100 may communicate with the memory controller 20a and each of the memory dies may be a memory device including, for example, dynamic memory cells such as a double data rate synchronous DRAM (DDR SDRAM), a low power DDR (LPDDR) SDRAM, a graphics DDR (GDDR) SDRAM, a Rambus DRAM (RDRAM), and the like, but the example embodiments are not limited thereto.

The buffer die 100, in a test mode of the stacked memory device 70, may perform a test on the dynamic memory cells of a target memory die corresponding to one of the memory dies 200a~200k, and may store as fail address information (e.g., a failed memory address information, etc.), the fail address information including an address of a memory cell row including at least one defective memory cell detected through the test, in at least one column decoder of other memory dies of the memory dies 200a~200k except (e.g., not including) the target memory die.

In at least one example embodiment, the stacked memory device 70 may transmit a fail address FL_ADDR to the memory controller 20a in the test mode and the memory controller 20a may perform a post package repair (PPR) on the memory dies 200a~200k based on the fail address FL_ADDR in a normal mode of the stacked memory device 70, etc.

Figure 2:
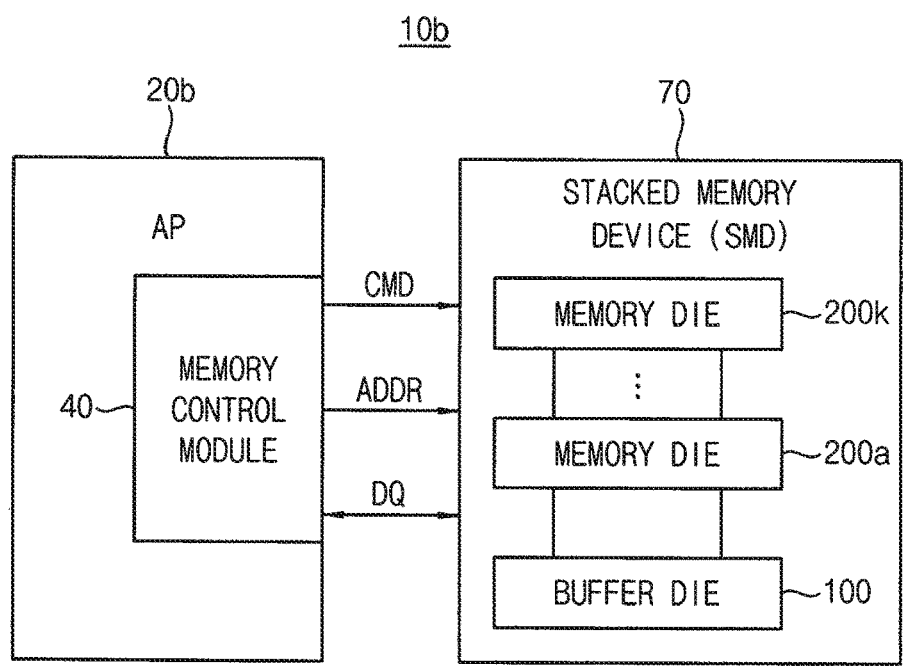
FIG. 2 is a block diagram illustrating a data processing system according to at least one example embodiment.

FIG. 2 is a block diagram illustrating a data processing system according to at least one example embodiment.

Referring to FIG. 2, a data processing system 10b may include at least one application processor 20b and/or at least one stacked memory device 70, but the example embodiments are not limited thereto and may contain other constituent components. The application processor 20b may include a memory control module 40 and/or the memory control module 40 included in application processor 20b, etc., and the stacked memory device 70 may constitute a memory system, but the example embodiments are not limited thereto.

The application processor 20b may perform a function of the host. Further, the application processor 20b may be implemented as a system on chip (SoC), FPGA, a multi-core processor, a multi-processor system, and/or other processing device(s). The SoC may include a system bus (not illustrated) to which a communication protocol having a desired and/or predetermined standard bus specification is applied, and may include various types of intellectual property (IP) cores, additional processing components (e.g., graphics processors, communication processors, etc.), memory devices, input/output devices, etc., connected to the system bus.

For example, as a standard specification of the system bus, an advanced microcontroller bus architecture (AMBA) protocol of Advanced RISC Machines (ARM) Holdings may be applied, but the example embodiments are not limited thereto. An advanced high-performance bus (AHB), an advanced peripheral bus (APB), an advanced eXtensible interface (AXI), AXI4, AXI coherency extensions (ACE), and the like, may be included as a type of the bus of the AMBA protocol, etc. In addition, other type of protocols such as uNetwork of Sonics Inc., CoreConnect of IBM Corp., Open Core Protocol of Open Core Protocol International Partnership Association, Inc. (OCP-IP), and the like, may also be applied.

The memory control module 40 may perform a function of the memory controller 20a in FIG. 1 according to at least one example embodiment.

Figure 3:
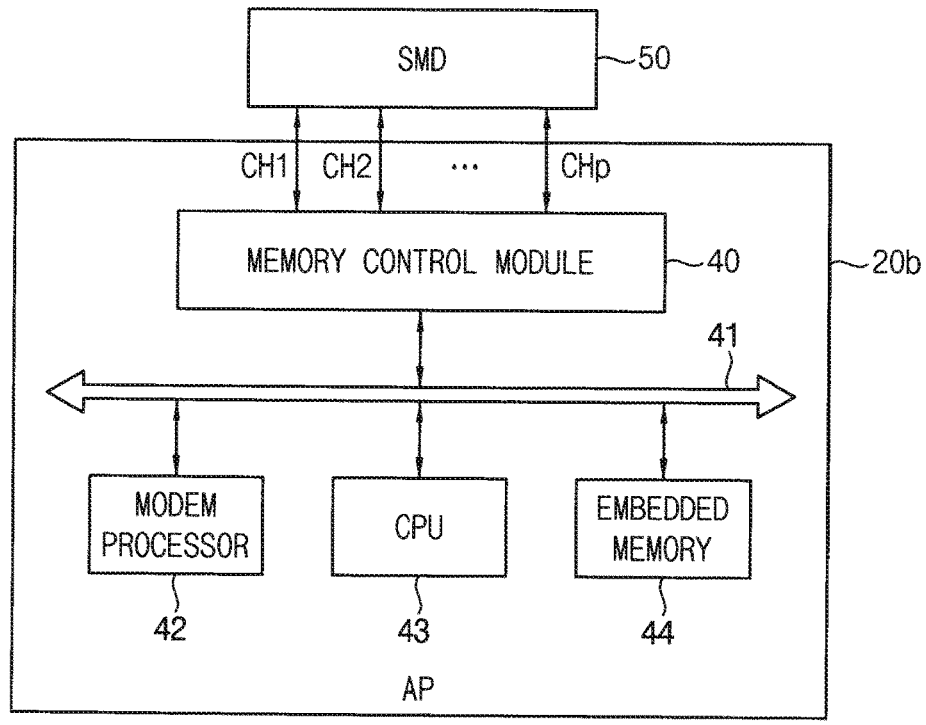
FIG. 3 is a block diagram illustrating an example of the application processor in FIG. 2 according to at least one example embodiment.

FIG. 3 is a block diagram illustrating an example of the application processor in FIG. 2 according to at least one example embodiment.

Referring to FIGS. 2 and 3, the application processor 20b may include a plurality of IP cores connected through a system bus 41, etc., but the example embodiments are not limited thereto. The application processor 20 may include, for example, the memory control module 40, at least one modem processor 42, at least one central processing unit (CPU) 43, and/or an embedded memory 44, etc.

The CPU 43 may control various types of operations of the IP cores inside application processor 40, and the modem processor 42 is at least one processor for performing wireless communication with a base station and/or other communication devices.

The memory control module 40 may communicate with the stacked memory device 70 disposed outside the application processor 20b through a plurality of independent channels corresponding to a plurality of memory cell groups CH1 to CHp, wherein p is a natural number greater than two. Further, the memory control module 40 may communicate with embedded memory 44 through the system bus 150B.

Figure 4:
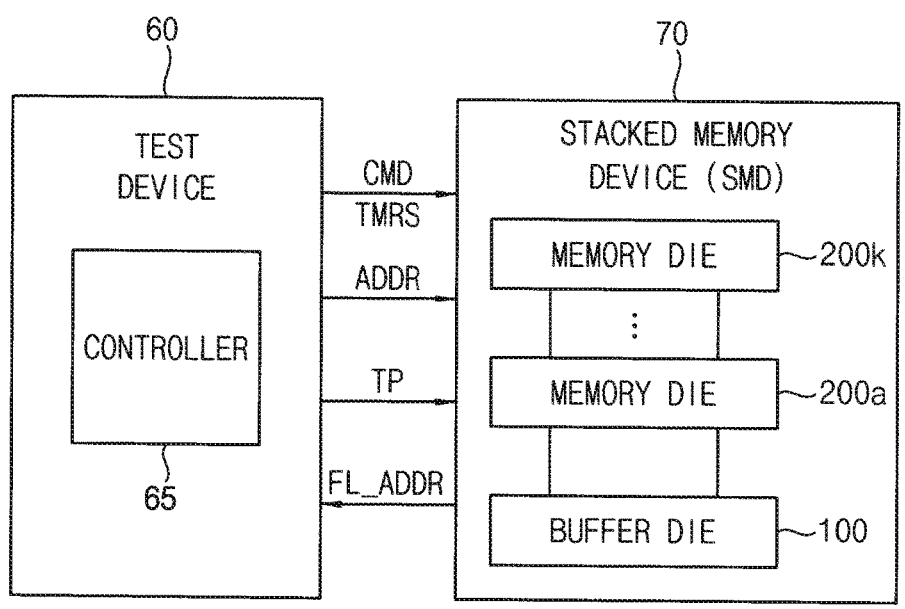
FIG. 4 is a block diagram illustrating another example of the memory system according to at least one example embodiment.

FIG. 4 is a block diagram illustrating another example of the memory system according to at least one example embodiment.

Referring to FIG. 4, a memory system 10c may include a test device 60 and/or a stacked memory device 70, etc., but is not limited thereto.

The test device 60 may perform a test on the buffer die 100 and/or the plurality of memory dies 200a~200k in the stacked memory device 70. For testing the buffer die 100 and the plurality of memory dies 200a~200k, the test device 60 may provide the command CMD, the address ADDR and/or a test pattern data TP to the stacked memory device 70, etc., and may receive a fail address FL_ADDR, and/or an address of a memory cell row including at least one defective memory cell, etc., from the stacked memory device 70.

The test device 60 may include a controller 65 that controls a test sequence on the stacked memory device 70.

Figure 5:
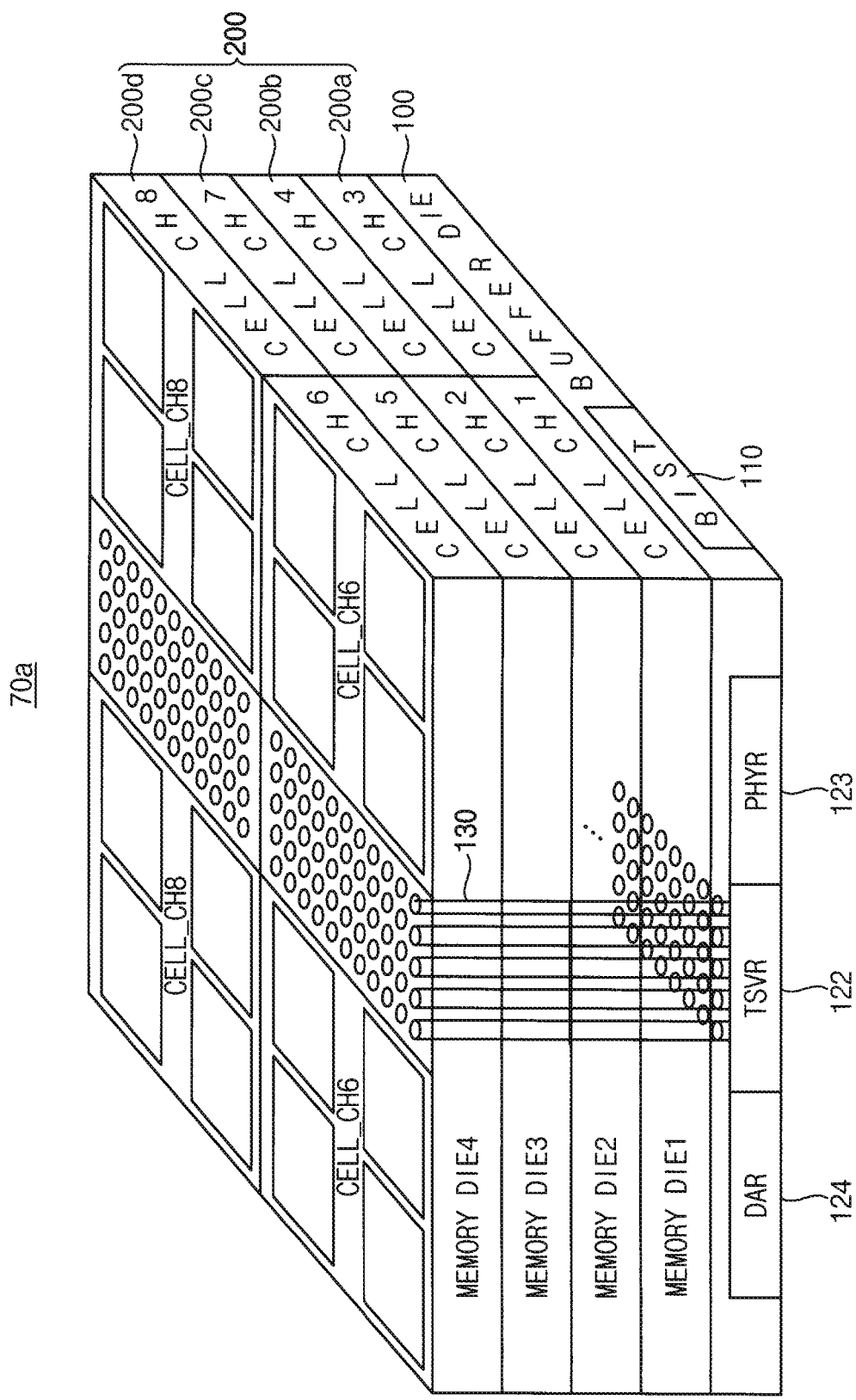
FIG. 5 is a block diagram illustrating an example of the stacked memory device in FIGS. 1 through 3 according to at least one example embodiment.

FIG. 5 is a block diagram illustrating an example of the stacked memory device in FIGS. 1 through 3 according to at least one example embodiment.

In FIG. 5, a memory device in a high bandwidth memory (HBM) form having an increased bandwidth by including a plurality of independent channels having independent interfaces is illustrated, but the example embodiments are not limited thereto.

Referring to FIG. 5, a stacked memory device 70a may include a plurality of layers. For example, the stacked memory device 70a may include a buffer die 100 and one or more memory dies 200 which are stacked on the buffer die 100, etc. In the example of FIG. 5, although first to fourth memory dies 200a to 200d are illustrated as being provided, the number of the core dies may be variously changed.

Further, each of the memory dies 200 may include one or more channels. A single memory die includes two channels in the example of FIG. 5, and thus an example in which the stacked memory device 70a has eight channels CH1 to CH8 is illustrated, but the example embodiments are not limited thereto.

For example, a first memory die 200a may include a first channel CH1 and a third channel CH3, a second memory die 200b may include a second channel CH2 and a fourth channel CH4, a third memory die 200c may include a fifth memory channel CH5 and a seventh channel CH7, and a fourth memory die 200d may include a sixth channel CH6 and an eighth channel CH8, etc.

The buffer die 100 may communicate with a memory controller (e.g., an external device, etc.), receive a command, an address, and/or data from the memory controller, and provide the received command, address, and/or data to the memory dies 200. The buffer die 100 may communicate with the memory controller through a conductive means (not illustrated) such as bumps, other electrical connections, and the like, which are formed on an outer surface thereof. The buffer die 100 may buffer the command, the address, and/or the data, etc., and thus the memory controller may interface with the memory dies 200 by driving only a load of the buffer die 100.

Further, the stacked memory device 70a may include a plurality of TSVs 130 passing through the layers, but the example embodiments are not limited thereto.

The TSVs 130 may be disposed corresponding to the plurality of channels CH1 to CH8, and the TSVs 130 may include components for inputting and outputting, for example, 1024-bit data when each of the independent channels has a 128-bit bandwidth, but the example embodiments are not limited thereto.

For example, the TSVs 130 may be disposed to pass through the first to fourth memory dies 200a to 200d, and each of the first to fourth memory dies 200a to 200d may include a transmitter/a receiver connected to the TSVs 130. When a normal operation in which the inputting and outputting of the data is independently performed for each channel, only the transmitter/receiver of any one core die may be enabled, with respect to each of the TSVs 130, and thus each of the TSVs 130 may independently deliver only the data of any one memory die, or any channel, as an independent channel for that one memory die or channel.

The buffer die 100 may include a test circuit 110, a TSV region 122, a physical region 123 and/or a direct access region 124, etc.

The TSV region 122 is a region in which TSVs 130 for communicating with the memory dies 200 are formed. Further, the physical region 123 is a region including a plurality of input-and-output (IO) circuits for communicating with an external memory controller, and various types of signals from the memory controller may be provided to the TSV region 122 through the physical region 123 and to the memory dies 200 through the TSVs 130.

The direct access region 124 may directly communicate with an external test device in a test mode for the stacked memory device 70a through a conductive means which is disposed on an outer surface of the stacked memory device 70a. Various types of signals provided from the tester may be provided to the memory dies 200 through the direct access region 124 and the TSV region 122. Additionally, various types of signals provided from the test device may be provided to the memory dies 200 through the direct access region 124, the physical region 123, and/or the TSV region 122, etc.

Although not illustrated, an internal command generator 120 (in FIG. 6) may control the test circuit 110 to sequentially perform the test on the memory dies 200 when the command corresponds to a test command and/or a test mode register set (TMRS) and to transmit a fail address to an external device whenever a test is completed on one memory die.

Figure 6:
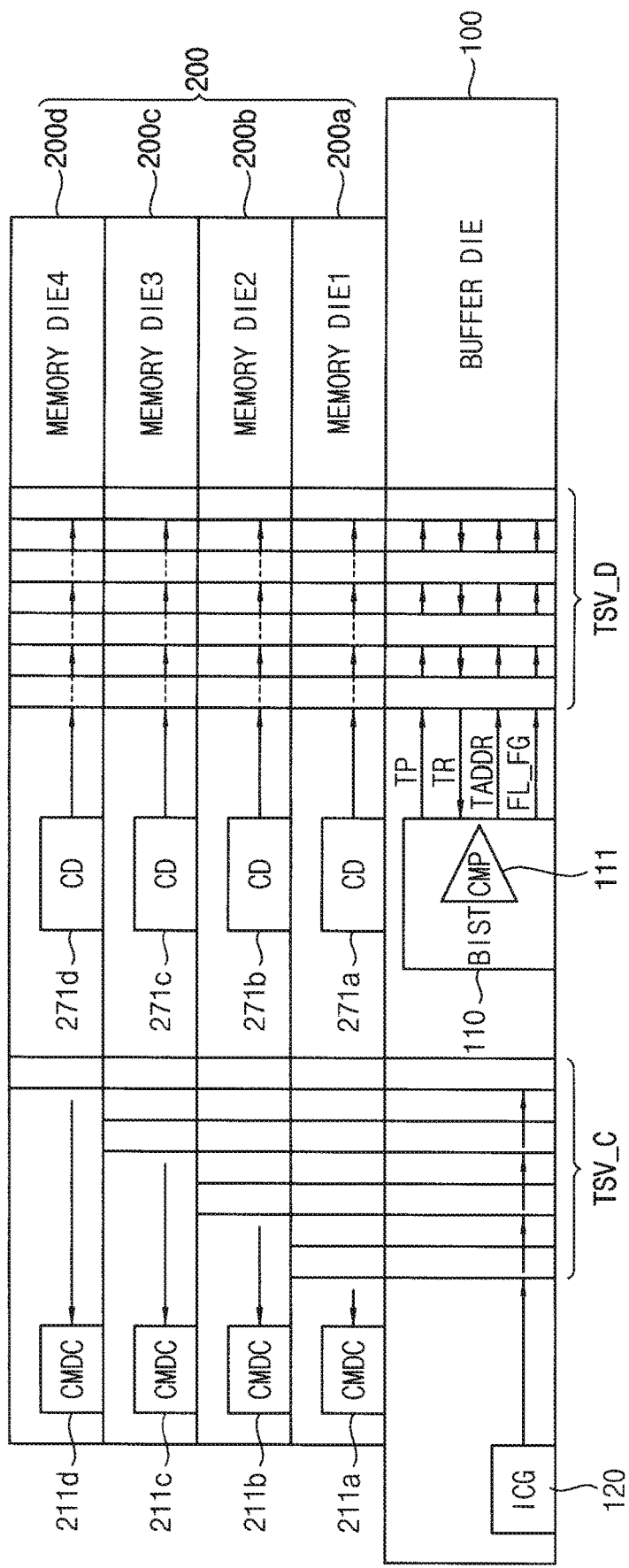
FIG. 6 illustrates that a test operation is performed in the stacked memory device of FIG. 5 according to at least one example embodiment.

FIG. 6 illustrates that a test operation is performed in the stacked memory device of FIG. 5 according to at least one example embodiment.

Referring to FIGS. 5 and 6, the buffer die 100 includes an internal command generator 120 and/or the test circuit 110, etc., and internal commands from the internal command generator 120 are provided to the memory dies 200 through command TSVs TSV_C which are independently formed for each channel.

The test circuit 110 provides the test pattern data TP and a target address TADDR to the target memory die of the memory dies 200 through data TSV TSV_D extending through the memory dies 200, receives the test result data TP in response to the pattern data TP, from the target memory die, and provides the target memory die with a fail flag signal FL_FG which indicates whether the target address TADDR is a fail address based on a comparison of the test pattern data TP and the test result data TR, etc.

The test circuit 110 may include a comparator 111 that outputs the fail flag signal FL_FG based on the comparison of the test pattern data TP and the test result data TR, etc.

The memory dies 200 may respectively include a plurality of command decoders 211a to 211d which output internal control signals by decoding internal commands, and/or a plurality of column decoders 271a to 271d which temporarily store the fail address, etc.

The fail address which is temporarily stored in the column decoder in the target memory die may be stored in at least one of the column decoders of the other memory dies, except (e.g., not including) the target memory die, through the data TSV TSV_D.

When the test is completed on the target memory die, the fail address which is stored in the at least one of the column decoders of the other memory dies may be provided to an external device through a data input/output path of the stacked memory device 70a.

Figure 7:
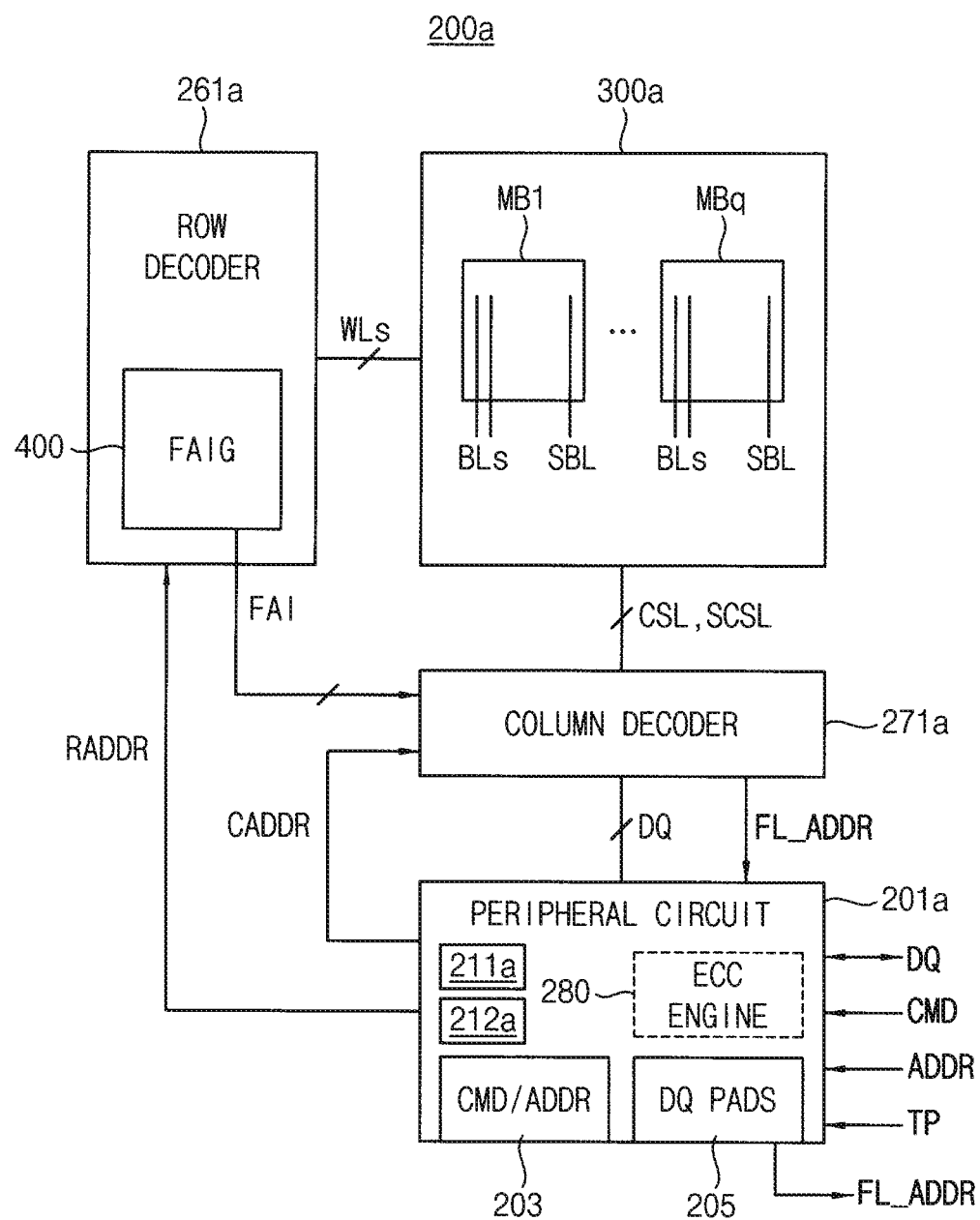
FIG. 7 is a block diagram illustrating an example of one of the memory dies in the stacked memory device in FIG. 1 according to at least one example embodiment.

FIG. 7 is a block diagram illustrating an example of one of the memory dies in the stacked memory device in FIG. 1 according to at least one example embodiment.

In FIG. 7, a configuration of the memory die 200a is illustrated, and each configuration of the plurality of memory dies 200b~200k may be substantially the same as the configuration of the memory die 200a.

Referring to FIG. 7, the memory die 200a includes a memory cell array 300a, a row decoder 261a, a column decoder 271a and/or a peripheral circuit 201a, but the example embodiments are not limited thereto.

The memory cell array 300a may include a plurality of memory blocks MB1~MBq (where, q is an integer greater than one), and each of the memory blocks MB1~MBq includes memory cells coupled to word-lines WLs and bit-lines BLs and spare cells coupled to the word-lines WLs and at least one spare bit-line SBL. The plurality of memory blocks MB1~MBk share the word-line WLs and do not share the bit-lines BLs and the spare bit-line SBL. Data associated with each of the memory blocks MB1~MBq may be input/output through corresponding input/output pad, but the example embodiments are not limited thereto.

The memory die 200a may receive an active command before receiving a write command and/or a read command from the outside (e.g., a memory controller and/or test equipment, other external source device, etc.). All memory cells connected to the word-line of the memory die 200a may be selected based on the active command. Afterwards, if the memory die 200a receives the write command and/or the read command, a plurality of bit-lines may be selected. In at least one example embodiment, the bit-lines BLs illustrated in the memory blocks MB1~MBq may be selected by the write command and/or the read command. The data input/output may be performed on memory cells coupled to the selected bit-lines BLs.

Additionally, according to at least one example embodiment, parity data for correction errors of data stored in at least one of the memory blocks MB1~MBq may be stored in some of the memory blocks MB1~MBq, but the example embodiments are not limited thereto and parity information may be not stored in other example embodiments.

The column decoder 271a may be connected to the memory cell array 300a through column selection lines CSL and spare column selection lines SCSL. The column decoder 271a may select the column selection lines CSL and/or the spare column selection lines SCSL based on a write command and/or a read command. If the column decoder 271a selects the column selection lines CSL, the bit-lines BLs are selected. When the column decoder 271a selects the spare column selection lines SCSL, the spare bit-lines SBL are selected.

The peripheral circuit 201a may include a command/address pads (CMD/ADD) 203, input/output pads 205, and/or an error correction code (ECC) engine 280, etc. In at least one example embodiment, the ECC engine 280 may not be included in the peripheral circuit 201a. The peripheral circuit 201a may receive the command CMD and the address ADDR from outside and may exchange data DQ with the outside. The peripheral circuit 201a may include the command decoder 211a and/or a mode register set 212a, but the example embodiments are not limited thereto.

The peripheral circuit 201a may provide a column address CADDR to the column decoder 271a and/or may provide a row address RADDR to the row decoder 261a according to the command CMD received from the outside (e.g., an external source). The peripheral circuit 201a may provide input data DQ to the column decoder 271a in response to the write command and/or may receive output data DQ from the column decoder 271a in response to the read command. The input data may be input to the peripheral circuit 201a through the input/output pads 205, etc. The output data may be output to the external device through the input/output pads 205, etc.

In addition, the peripheral circuit 201a may provide the test pattern data TP to the column decoder 271a and/or may provide the test result data TR responding to the test pattern data TP to the test pattern data TP, from the column decoder 271a to the test circuit 110 in the test mode. The peripheral circuit 201a may provide the fail flag signal FL_FG to the row decoder 261a in the test mode.

According to some example embodiments, the ECC engine 280 may perform an ECC encoding on the input data to generate parity data. The ECC engine 280 may store the input data and the parity data in one or more of the memory blocks MB1~MBq. The ECC engine 280 may perform an ECC decoding on the data read from the one or more memory blocks MB1~MBq to correct at least one error in the read data. The ECC engine 280 may transmit the corrected data to the external device through the input/output pads 205.

The row decoder 261a may activate a first word-line designated by the row address RADDR in response to the row address RADDR in a normal mode. The row decoder 261a may activate a first word-line designated by the row address RADDR in the test mode. The row decoder 261a may include a fail address information generator 400, and the fail address information generator 400 may provide the row address RADDR as a fail address information FAI to the column decoder 271a in response to the fail flag signal FL_FG when the first word-line is coupled to at least one defective cell in the test mode.

The column decoder 271a temporarily stores the fail address information FAI, and/or provides the stored fail address information FAI to the peripheral circuit 201a as a fail address FL_ADDR. The peripheral circuit 201a may store the fail address FL_ADDR in a column decoder in at least one of other memory dies 200b~200k except (e.g., not including) the memory die (e.g., the target memory die) 200a.

Figure 8:
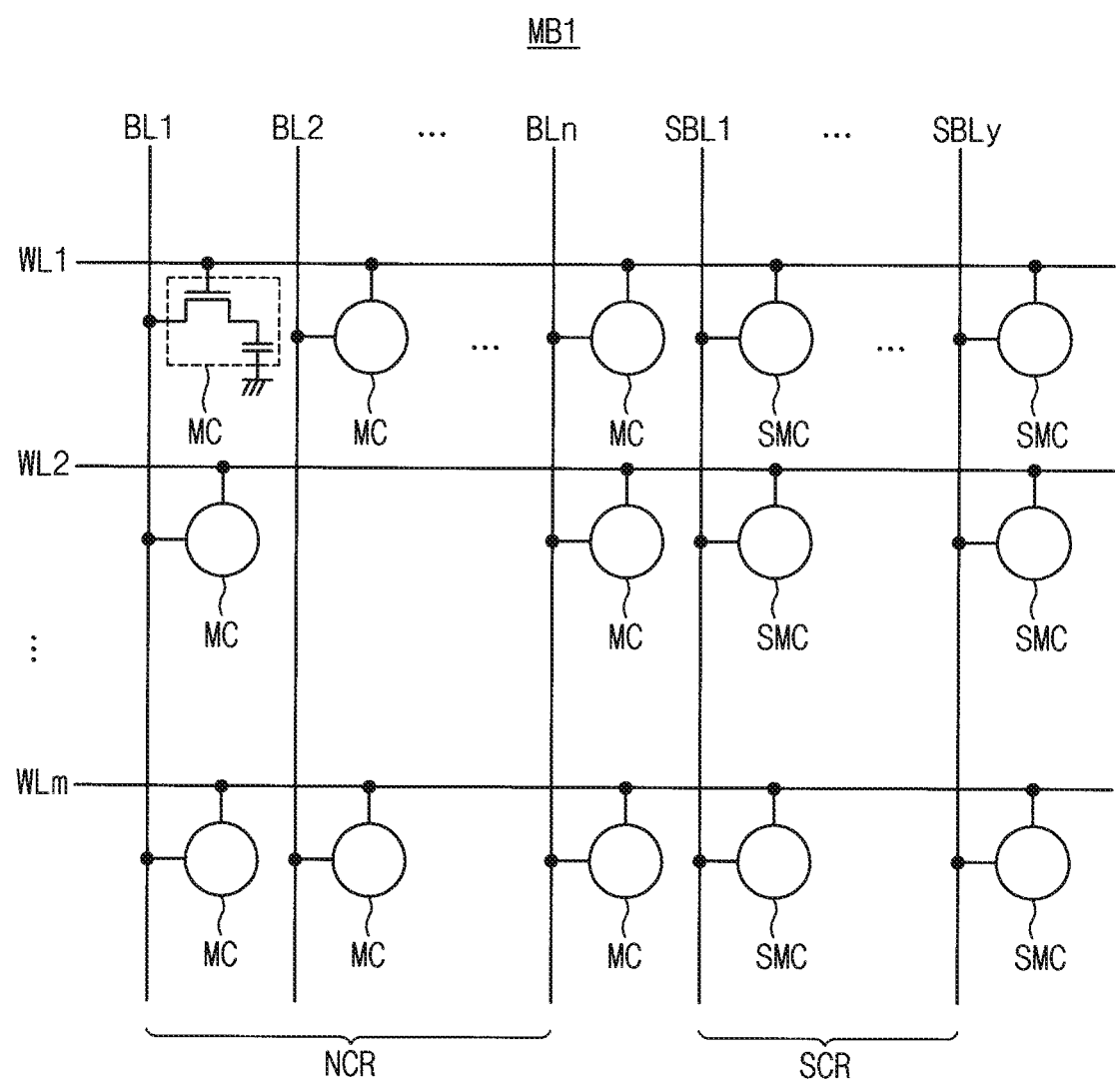
FIG. 8 illustrates an example of a first memory block in the memory die of FIG. 7 according to at least one example embodiment.

FIG. 8 illustrates an example of a first memory block in the memory die of FIG. 7 according to at least one example embodiment.

Referring to FIG. 8, the first memory block MB1 includes a normal cell region NCR and/or a spare cell region SCR, etc. The normal cell region NCR includes a plurality of word-lines WL1~WLm (m is a natural number greater than two), a plurality of bit-lines BL1~BLn (n is a natural number greater than two), and a plurality of memory cells MCs disposed at intersections between the word-lines WL1~WLm and the bit-lines BL1~BLn. The spare cell region SCR includes a plurality of spare bit-lines SBL1~SBLy (y is a natural number greater than two), the word-lines WL1~WLm, and a plurality of spare cells SMCs disposed at intersections between the word-lines WL1~WLm and the spare bit-lines SBL1~SBLy.

The word-lines WL1~WLm extend in a first direction D1 and the bit-lines BL1~BLn and the spare bit-lines SBL1~SBLy extend in a second direction D2 crossing the first direction D1. The first memory block MB1 may be divided into a plurality of segments in the second direction by segment identity bits of the row address.

Figure 9:
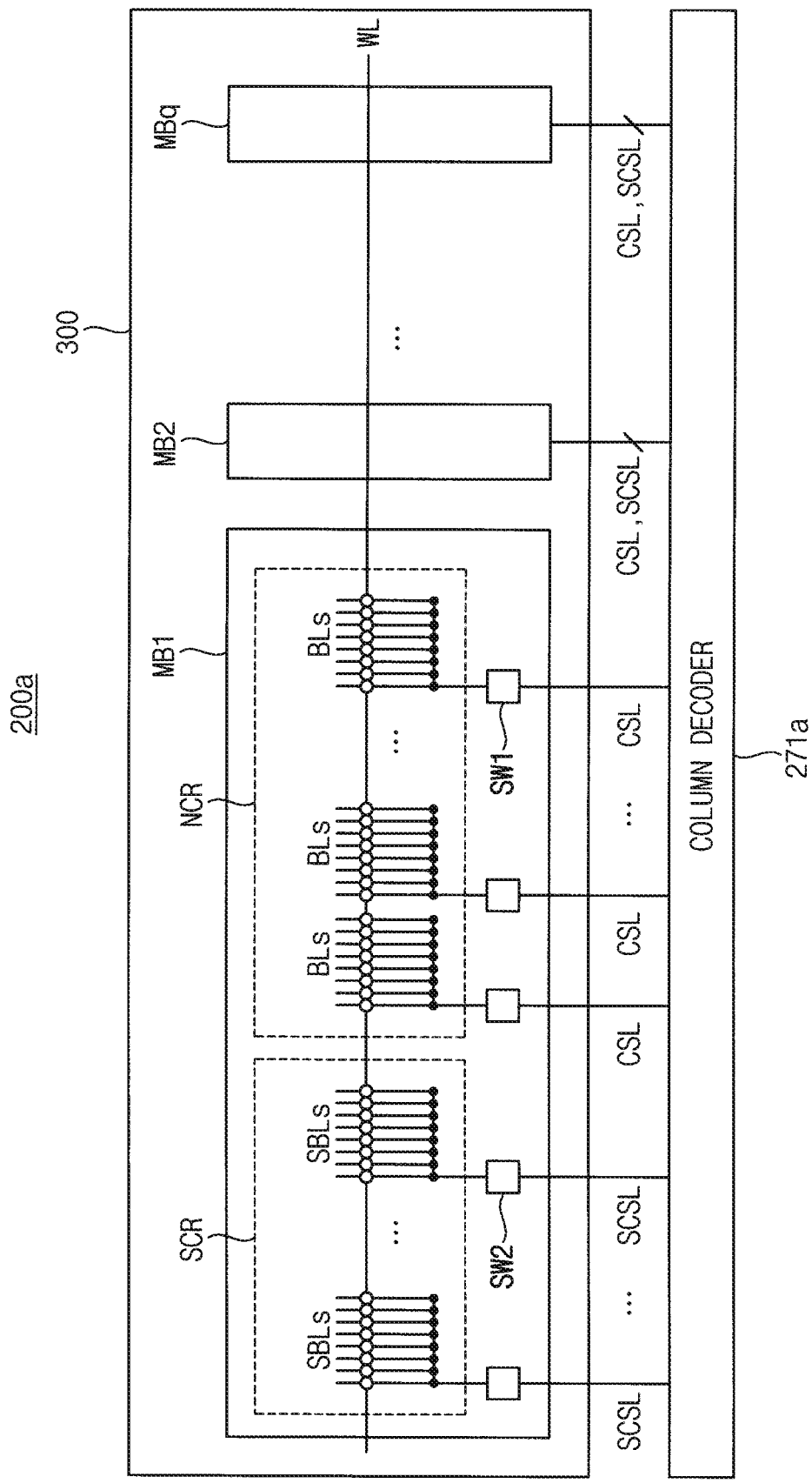
FIG. 9 illustrates a relationship between column selection lines and bit-lines shown in FIG. 8 according to at least one example embodiment.

FIG. 9 illustrates a relationship between column selection lines and bit-lines shown in FIG. 8 according to at least one example embodiment.

In FIG. 9, only the first memory block MB1 is shown in detail for brevity of illustration. Each of the memory blocks MB2~MBq may be configured and/or implemented the same as the first memory block MB1, but is not limited thereto. Also, for brevity of illustration, only one word-line WL is illustrated in FIG. 9, and the peripheral circuit 201a and the row decoder 261a in FIG. 8 are not illustrated.

The column decoder 271a may select the column selection lines CSL of each of the memory blocks MB1~MBq based on the write command and/or the read command. Each of the column selection lines CSL may be connected with a plurality of bit-lines BLs through a switch SW1. The column decoder 271a may selectively select the spare column selection lines SCSL of each of the memory blocks MB1~MBq based on the write command and/or the read command instead of the column selection line CSL. The spare column selection lines SCSL may be connected with spare bit-lines SBLs through a switch SW2.

Figure 10:
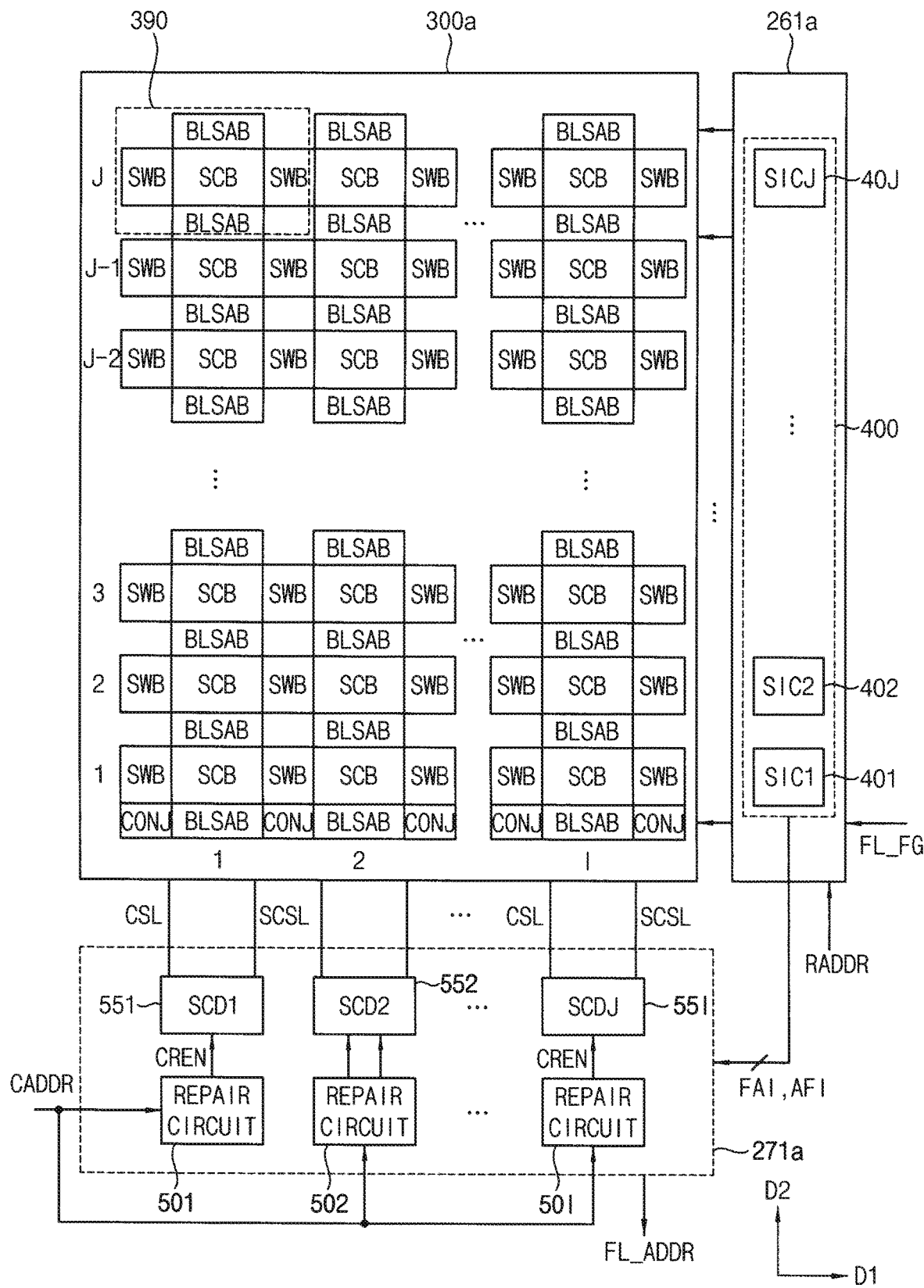
FIG. 10 illustrates the memory cell array, the row decoder and the column decoder in the memory die of FIG. 7 according to at least one example embodiment.

FIG. 10 illustrates the memory cell array, the row decoder and the column decoder in the memory die of FIG. 7 according to at least one example embodiment.

Referring to FIG. 10, in the memory cell array 300a, I sub-array blocks SCB may be disposed in the first direction D1, and J sub-array blocks SCB may be disposed in the second direction D2 substantially perpendicular to the first direction D1. I sub-array blocks SCB may be disposed in the first direction D1, and J sub-array blocks SCB disposed in the first direction D1 in one row may be referred to as a row block. A plurality of bit-lines, a plurality of word-lines, and a plurality of memory cells may be disposed in each of the sub-array blocks SCB.

I+1 sub word-line driver regions SWB may be disposed between the sub-array blocks SCB in the first direction D1. Each sub-array block SCB may correspond to a segment of each of the memory blocks. Sub word-line drivers may be disposed in the sub word-line driver regions SWB. J+1 bit-line sense amplifier regions BLSAB may be disposed, for example between the sub-array blocks SCB in the second direction D2. Bit-line sense amplifiers to sense data stored in the memory cells may be disposed in the bit-line sense amplifier regions BLSAB.

A plurality of conjunction regions CONJ may be disposed adjacent the sub word-line driver regions SWB and the bit-line sense amplifier regions BLSAB. A voltage generator is disposed in each of the conjunction regions CONJ.

The row decoder 261a includes the fail address information circuit 400, and the fail address information generator 400 may include a plurality of segment information circuits 401~40J corresponding to the segments in the second direction D2, etc. The segment information circuits 401~40J may output the fail address information FAI and/or anti-fuse information FAFI to the column decoder 271a in response to the row address RADDR and the fail flag signal FL_FG.

The column decoder 271a may include a plurality of sub column decoders 551~55I and/or a plurality of repair circuits 501~50I, etc. Each of the sub column decoders 551~55I may be connected to a corresponding memory block of the plurality memory blocks and the plurality of repair circuits 501~50I may correspond to the plurality of sub column decoders 551~55I. Each of the repair circuits 501~50I may selectively activate a repair signal CREN in response to the column address CADDR and the anti-fuse information AFI to provide the repair signal CREN to corresponding one of the sub column decoders 551~55I in the normal mode.

Each of the sub column decoders 551~55I may select the column selection lines CSL and/or the spare column selection line SCSL in response to the repair signal CREN in the normal mode.

When the repair signal CREN is deactivated, each of the sub column decoders 551~55I may select the column selection line CSL. When the repair signal CREN is activated, each of the sub column decoders 551~55I may select the spare column selection line SCSL.

Each of the repair circuit 501~50I may temporarily store the fail address information FAI provided from the row decoder 261a and/or may output the fail address information FAI as the fail address FL_ADDR in the test mode.

Figure 11:
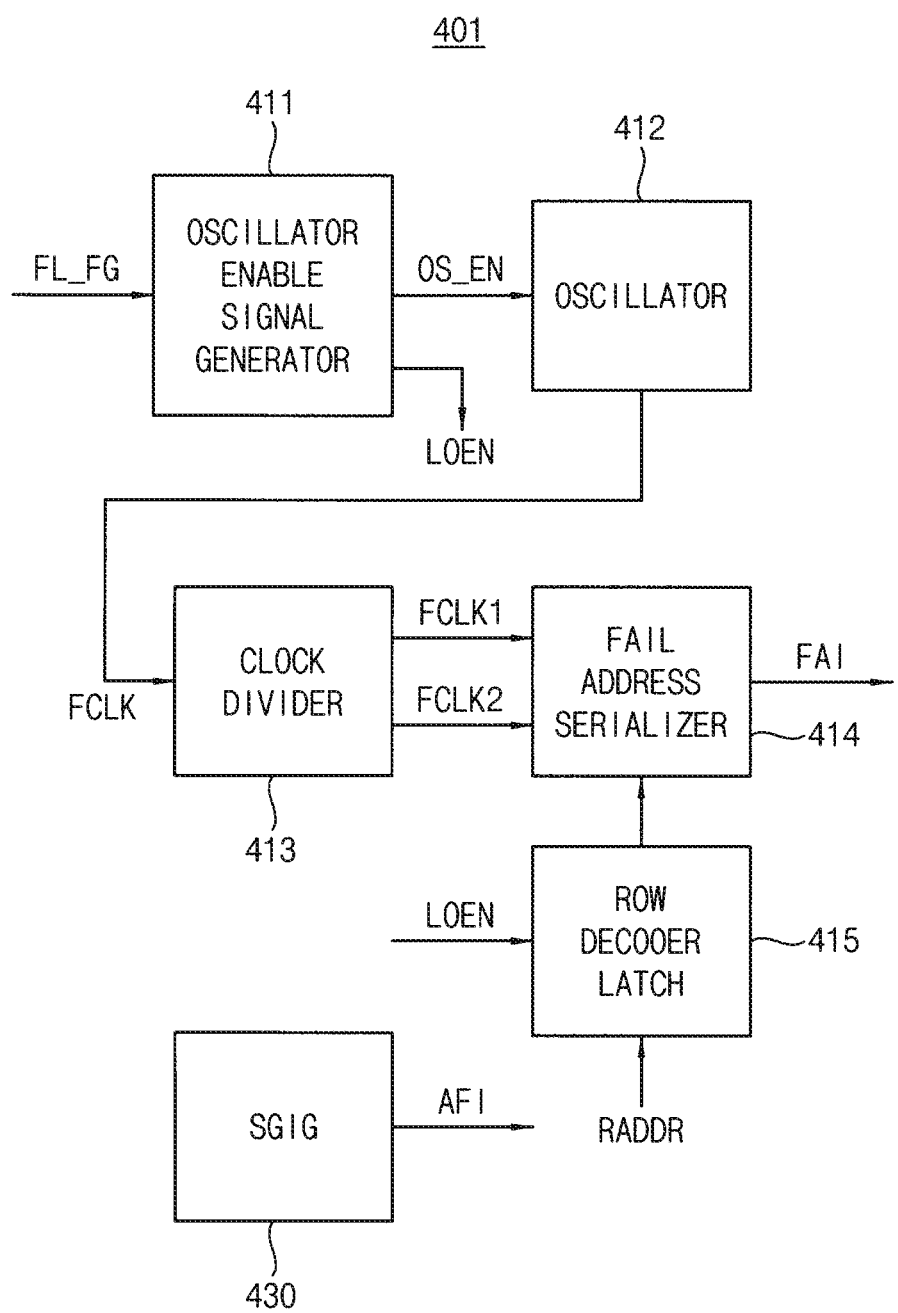
FIG. 11 is a block diagram illustrating a first segment information circuit of the segment information circuits in FIG. 10 according to at least one example embodiment.

FIG. 11 is a block diagram illustrating a first segment information circuit of the segment information circuits in FIG. 10 according to at least one example embodiment.

Each of the segment information circuits 402-40J may have substantially the same configuration as the first segment information circuit 401, but is not limited thereto.

Referring to FIG. 11, the first segment information circuit 401 includes an oscillator enable signal generator 411, an oscillator 412, a clock divider 413, a row decoder latch 415, and/or a fail address serializer 414 (e.g., a fail address serializer circuit), etc. The first segment information circuit 401 may further include a segment information generator 430.

The oscillator enable signal generator 411 generates an oscillator enable signal OS_EN and/or a latch output enable signal LOEN in response to the fail flag signal FL_FG provided from the test circuit 110. The oscillator 412 outputs a clock signal FCLK that oscillates in response to the oscillator enable signal OS_EN.

The clock divider 413 divide the clock signal FCLK to generate a first clock signal FCLK1 and/or a second clock signal FCLK2, but is not limited thereto. The row decoder latch 415 latch the row address RADDR in the test mode and/or provides row address RADDR to the fail address serializer 414 in response to the latch output enable signal LOEN.

The fail address serializer 414 serializes row addresses provided from the row decoder latch 415 in response to the first clock signal FCLK1 and the second clock signal FCLK2 to provide the serialized row addresses as the fail address information FAI to the column decoder 271a.

The segment information generator 430 may store the anti-fuse information AFI associated with a repair of a corresponding segment and/or may provide the anti-fuse information AFI to the column decoder 271a, etc.

Figure 12:
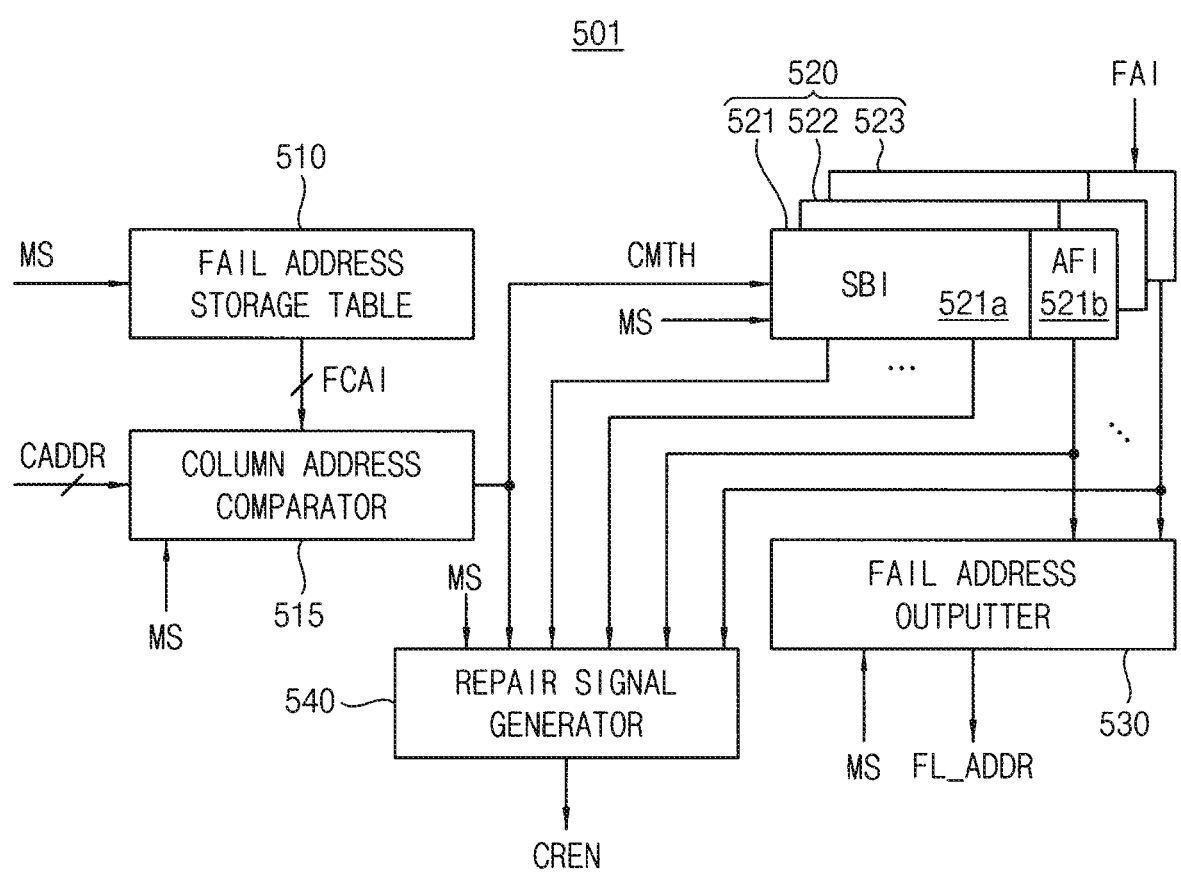
FIG. 12 is a block diagram illustrating a first repair circuit of the repair circuits in FIG. 10 according to at least one example embodiment.

FIG. 12 is a block diagram illustrating a first repair circuit of the repair circuits in FIG. 10 according to at least one example embodiment.

Each configuration of the repair circuits 502~50J may be substantially the same as a configuration of the first repair circuit 501, but the example embodiments are not limited thereto.

Referring to FIG. 12, the first repair circuit 501 includes a fail address storage table 510, a column address comparator 515, a fuse information storage circuit 520, a fail address outputter 530 (e.g., a fail address output circuit), and/or a repair signal generator 540.

The fail address storage table 510 may store fail column address information FCAI associated with column address information of defective cells of a corresponding memory block. The column address comparator 515 may compare the column address CADDR with the fail column address information FCAI to output a column match signal CMTH to the fuse information storage circuit 520 and/or the repair signal generator 540, etc. The column match signal CMTH may indicate whether the column address CADDR matches the fail column address information FCAI, or not.

The fuse information storage circuit 520 includes a plurality of unit sets 521, 522 and 523, etc. Each of the unit sets 521, 522 and 523 may include a first region 521a and a second region 521b, but are not limited thereto. The first region 521a may store a spare bit-line information SBI on a spare bit-line to repair a defective cells in each of the segments in the corresponding memory block and the second region 521b may store the anti-fuse information AFI associated with a usability of a spare bit-line of the corresponding segment (e.g., the usability of a spare bit-line in a different segment). The first region 521a and the second region 521b may have static random access memory (SRAM) cell architecture, but the example embodiments are not limited thereto.

The fuse information storage circuit 520 may store the spare bit-line information SBI and the anti-fuse information AFI in the normal mode and may store the fail address information FAI in the test mode.

The fuse information storage circuit 520 may provide the spare bit-line information SBI and the anti-fuse information AFI to the repair signal generator 540 in response to the column match signal CMTH in the normal mode.

The repair signal generator 540 may determine a logic level of the repair signal based on the column match signal CMTH, spare bit-line information SBI, and/or the anti-fuse information AFI in the normal mode.

For example, when the column match signal CMTH indicates the column address CADDR does not match the fail column address information FCAI, the repair signal generator 540 deactivates the repair signal CREN. In this case, the first sub column decoder 551 in FIG. 10 selects the column selection line CSL.

For example, when the column match signal CMTH indicates the column address CADDR matches the fail column address information FCAI and the anti-fuse information AFI indicates that a spare bit-line in a corresponding segment is usable, the repair signal generator 540 activates the repair signal CREN with a high level (e.g., a high signal, a high voltage level, etc.). In this case, the first sub column decoder 551 in FIG. 10 selects the spare column selection line SCSL.

The fuse information storage circuit 520 may provide the fail address information FAI to the fail address outputter 530 in the test mode and/or the fail address outputter 530 may store the fail address information FAI as the fail address FL_ADDR in a fuse information storage circuit of the column decoder in another memory die through the data TSV YSV_D connected to the peripheral circuit 201a.

The command decoder 211a may provide a mode signal MS to the fail address storage table 510, the column address comparator 515, the fuse information storage circuit 520, the fail address outputter 530, and/or the repair signal generator 540, etc. The mode signal MS may indicate one of the normal mode and the test mode of the memory die 200a.

Figure 13:
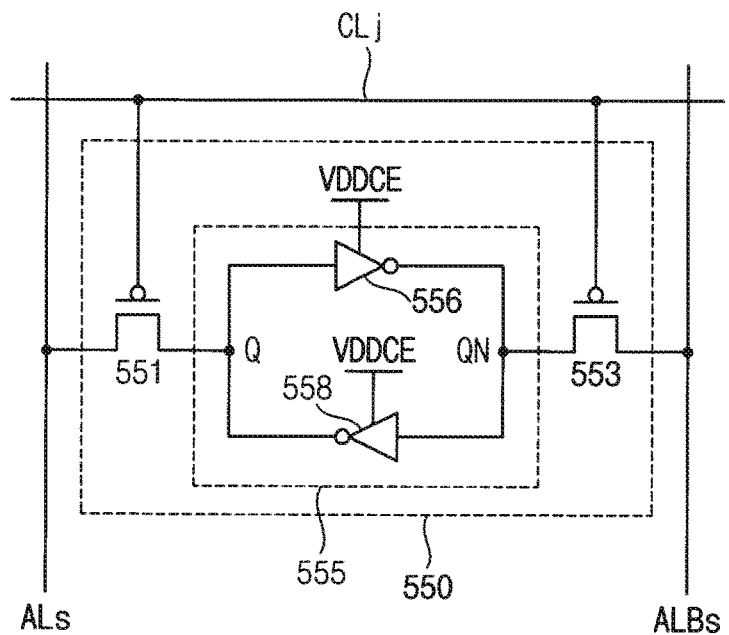
FIG. 13 illustrates one of SRAM cells that may constitute the fuse information storage circuit in FIG. 12 according to at least one example embodiment.

FIG. 13 illustrates one of SRAM cells that may constitute the fuse information storage circuit in FIG. 12 according to at least one example embodiment.

Referring to FIG. 13, an SRAM cell 550 may include a first access transistor 551, a second access transistor 553, and/or a data storage circuit 555, etc., but the example embodiments are not limited thereto.

The data storage circuit 555 may store a single-bit of data, but the example embodiments are not limited thereto. The data storage circuit 555 may include a first inverter 556 and a second inverter 558, etc. An output terminal of the first inverter 556 is coupled to an input terminal of the second inverter 558, and an output terminal of the second inverter 558 is coupled to an input terminal of the first inverter 556. Therefore, the first inverter 556 and the second inverter 558 constitutes a latch circuit.

The first access transistor 551 may be connected between a s_th access line ALs and a first node Q coupled to the input terminal of the first inverter 556. The first access transistor 551 includes a gate coupled to a control line CLj. The second access transistor 553 may be connected between a s_th complementary access line ALBs and a second node QN coupled to the input terminal of the second inverter 558. The second access transistor 553 includes a gate coupled to the control line CLj.

Figure 14:
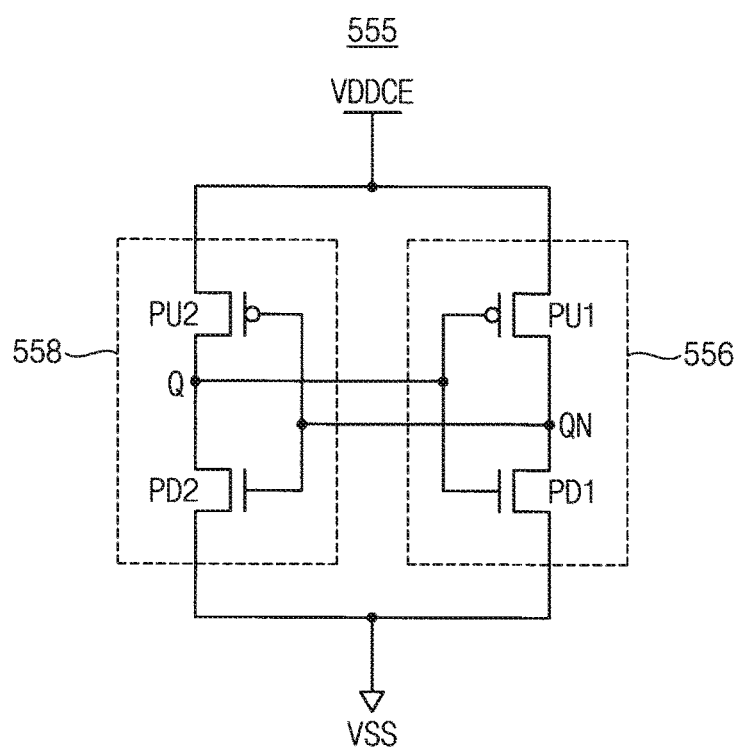
FIG. 14 is a circuit diagram illustrating a first inverter and a second inverter of the data storage circuit in FIG. 13 according to at least one example embodiment.

FIG. 14 is a circuit diagram illustrating a first inverter and a second inverter of the data storage circuit in FIG. 13 according to at least one example embodiment.

Referring to FIG. 14, the first inverter 556 includes a first pull-up transistor PU1 and a first pull-down transistor PD1, etc. The second inverter 558 includes a second pull-up transistor PU2 and a second pull-down transistor PD2, etc.

The first pull-up transistor PU1 may be a p-channel metal-oxide semiconductor (PMOS) transistor that includes a source coupled to the first power supply voltage VDDCE, a drain coupled to the second node QN, and a gate coupled to the first node Q, etc. The first pull-down transistor PD1 may be a n-channel metal-oxide semiconductor (NMOS) transistor that includes a drain coupled to the second node QN, a source coupled to a ground voltage VSS, and a gate coupled to the first node Q, but the example embodiments are not limited thereto.

The second pull-up transistor PU2 may be a PMOS transistor that includes a source coupled to the first power supply voltage VDDCE, a drain coupled to the first node Q, and a gate coupled to the second node QN, but the example embodiments are not limited thereto. The second pull-down transistor PD2 may be an NMOS transistor that includes a drain coupled to the first node Q, a source coupled to the ground voltage VSS, and a gate coupled to the second node QN, but the example embodiments are not limited thereto. The first node Q may be coupled to the first access transistor 551 in FIG. 13 and the second node QN may be coupled to the second access transistor 553 in FIG. 13, but the example embodiments are not limited thereto.

Figure 15:
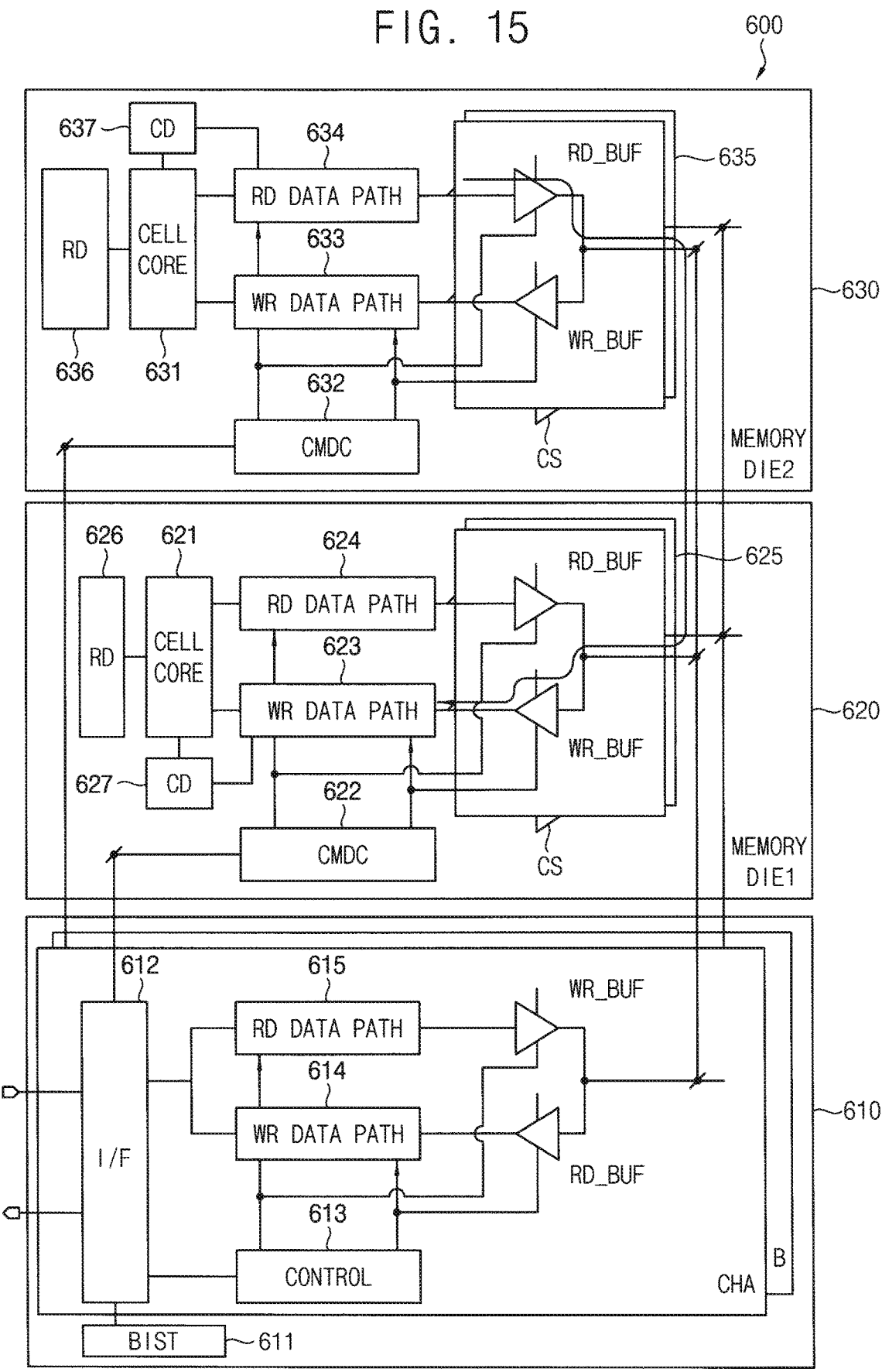
FIG. 15 is a block diagram illustrating an example in which a test operation is performed in the stacked memory device according to at least one example embodiment.

FIG. 15 is a block diagram illustrating an example in which a test operation is performed in the stacked memory device according to at least one example embodiment.

Hereinafter, operations of a single buffer die and two memory dies are illustrated for convenience of description, but the example embodiments are not limited thereto. The test circuit may perform a function in which a chip selection signal CS for selection of a channel and/or a chip is provided according to the internal data processing operation. In addition, the chip selection signal CS illustrated in the following drawing may be implemented to be generated through the command decoder of each of the memory dies.

Referring to FIG. 15, a stacked memory device 600 may include a buffer die 610 and first and second memory dies 620 and 630 according to at least one example embodiment.

The buffer die 610 may communicate with a memory controller, and may include a test circuit 611 that performs a test on one or more memory dies, such as the first and second memory dies 610 and 610, in response to a test command and/or TMRS signal from the memory controller. The test circuit 611 provides the test command and/or the TMRS signal to, e.g., the first and second memory dies 620 and 630, while changing the chip selection signal CS for selecting the memory die. Further, data may be transmitted and received between the buffer die 610 and the one or more memory dies, e.g., the first and second memory dies 620 and 630, and data TSVs for transmitting and/or receiving the data may be commonly disposed in the buffer die 610 and, e.g., the first and second memory dies 620 and 630.

The buffer die 610 may include a plurality of input/output (I/O) circuits in order to independently perform interfacing with channels for the first and second memory dies 620 and 630. For example, the buffer die 610 may include an I/O circuit for the A_th channel CH_A which interfaces with the first memory die 620, and an I/O circuit for the B_channel CH_B which interfaces with the second memory die 630. Various components provided in each of the I/O circuits may be disposed in at least one region of the buffer die 610, and for example, the components of each of the I/O circuits may be disposed in a physical region.

In addition, the I/O circuit corresponding to each of the channels may include an interface 612 which interfaces with the memory controller, a path controller 613, a read data path 614, and/or a write data path 615, etc., but the example embodiments are not limited thereto.

The test circuit 611 may control the first and second memory dies 620 and 630 such that the test based on the test command and the TMRS signal from the memory controller is performed on, for example, the first and second memory dies 620 and 630.

The first memory die 620 may include a cell core 621 including a memory cell area, a row decoder 626, a column decoder 627, a command decoder 622 which decodes an internal command, a write data path 623, a read data path 624, and/or a transceiver 625, etc.

The second memory die 630 may be implemented in the same or similar manner as the first memory die 620, but is not limited thereto. The second memory die 630 may include a cell core 631 including a memory cell area, a row decoder 636, a column decoder 637, a command decoder 632 which decodes an internal command, a write data path 633, a read data path 634, and/or a transceiver 635, etc.

When a test is performed on the second memory die 630 according to the test command and/or the TMRS signal from the memory controller, a fail address of a cell core 631 in the second memory die 630 is temporarily stored in the column decoder 637, the fail address stored in the column decoder 637 is provided to the transceiver 635 through the read data path 634, is provided to the transceiver 625 in the first memory die 620 through a read buffer RD_BUF in the transceiver 635 and the data TSV, and is stored in (e.g., inside of, on, etc.) the column decoder 627 in the first memory die 620.

When the test is completed on the cell core 631 in the second memory die 630, the fail addresses of the second memory die 630 stored in the column decoder 627 in the first memory die 620 is provided to the interface 612 through the read data path 624, the transceiver 625, the data TSV in the first memory die 620, and/or the write data path 615 in the buffer die 610, etc., and the interface 612 may transmit the fail addresses of the second memory die 630 to the memory controller.

The external memory controller may perform a PPR on the defective cells in the second memory die 630 based on the fail addresses of the second memory die 630.

Although not illustrated, each of the column decoders 627 and 637 may be connected to the write data paths 623 and 633 and the read data path 634 and 634 respectively through a switch, but the example embodiments are not limited thereto.

Figure 16:
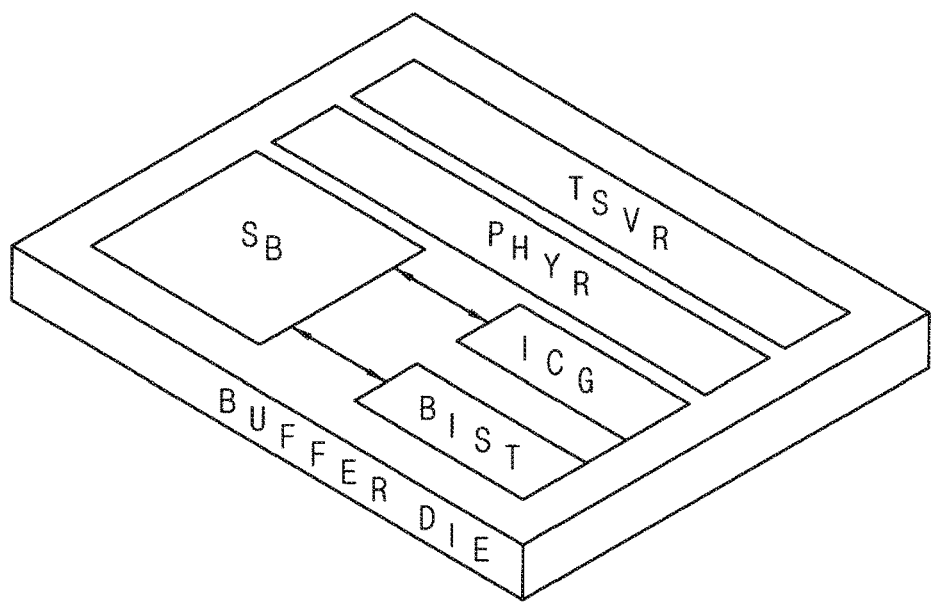
FIG. 16 is a block diagram illustrating an example of a buffer die included in the stacked memory device according to at least one example embodiment.

FIG. 16 is a block diagram illustrating an example of a buffer die included in the stacked memory device according to at least one example embodiment.

Referring to FIG. 16, a buffer die 100*a* may include a physical region PHYR which interfaces with the memory controller and/or a TSV region TSVR in which a plurality of TSVs are formed to communicate with one or more memory dies, etc. In addition, the buffer die 100*a* may further include an internal common bus SB shared by a plurality of channels included in the memory dies, but the example embodiments are not limited thereto. Various types of signals may be provided to the plurality of channels through the internal common bus SB. The internal common bus SB is connected to the TSV region TSVR through the physical region PHYR in which has I/O circuits corresponding to the plurality of channels.

The buffer die 100a may further include the internal command generator ICG and the test circuit BIST which are mentioned above. The internal command generator ICG may convert the command from the memory controller to the internal command and/or transmit the internal command to a corresponding memory die, etc. The test circuit BIST may sequentially perform the test on the memory dies in response to the test command and/or the TMRS signal from the memory controller.

Figure 17:
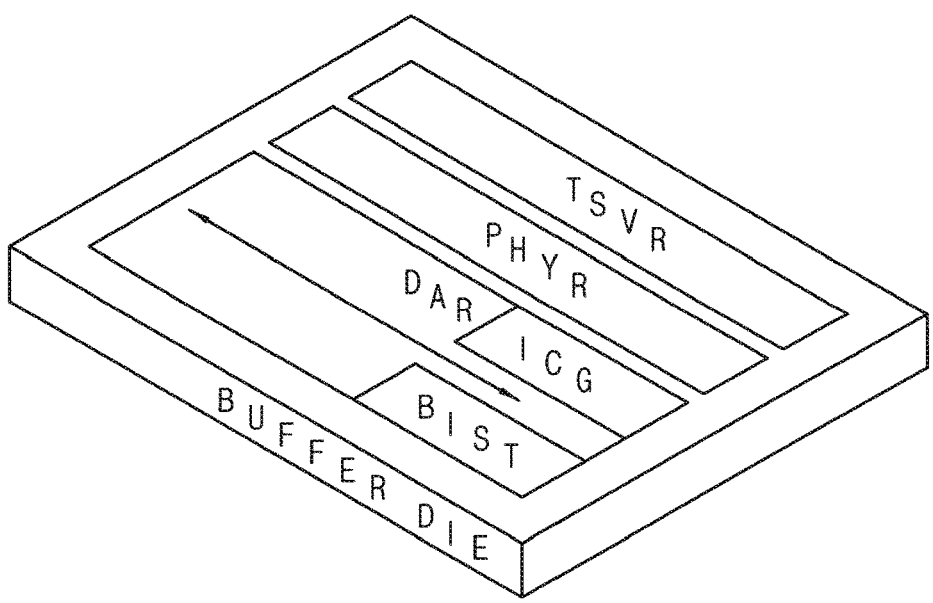
FIG. 17 is a block diagram illustrating another example of a buffer die included in the stacked memory device according to at least one example embodiment.

FIG. 17 is a block diagram illustrating another example of a buffer die included in the stacked memory device according to at least one example embodiment.

Referring to FIG. 17, a buffer die 100b may include a physical region PHYR which interfaces with the memory controller and/or a TSV region TSVR in which a plurality of TSVs are formed to communicate with one or more memory dies, etc., but the example embodiments are not limited thereto.

In addition, the buffer die 100b may further include a direct access region DAR in which a bus which may directly communicate with an external test device is disposed, regardless of the memory controller. A signal related to the test, which is provided to the direct access region DAR, may be delivered to the TSVs through the bus in the direct access region DAR, and a test result may be provided to the external test device through the TSV region TSVR and the direct access region DAR. The physical region PHYR may be disposed adjacent to the TSV region TSVR and the direct access region DAR may be disposed adjacent to the TSV region TSVR, but the example embodiments are not limited thereto.

A test operation using the direct access region DAR may be performed with respect to a plurality of channels, and in this case, a bus in the direct access region DAR related to the test may be implemented to be shared by the plurality of channels of the stacked memory device.

In at least one example embodiment, the internal signal generator ICG and the test circuit BIST may be formed in the direct access region DAR, but the example embodiments are not limited thereto. The internal command generator ICG may generate an internal command and/or provide the generated internal command to the memory dies through the bus in the direct access region DAR. Further, data read from the core dies may be provided to the outside through the bus in the direct access region DAR. In the test mode, the test circuit BIST may provide the test pattern data to the memory dies through the bus in the direct access region DAR and test result data from the memory dies may be provided to the test circuit BIST through the bus in the direct access region DAR.

Figure 18:
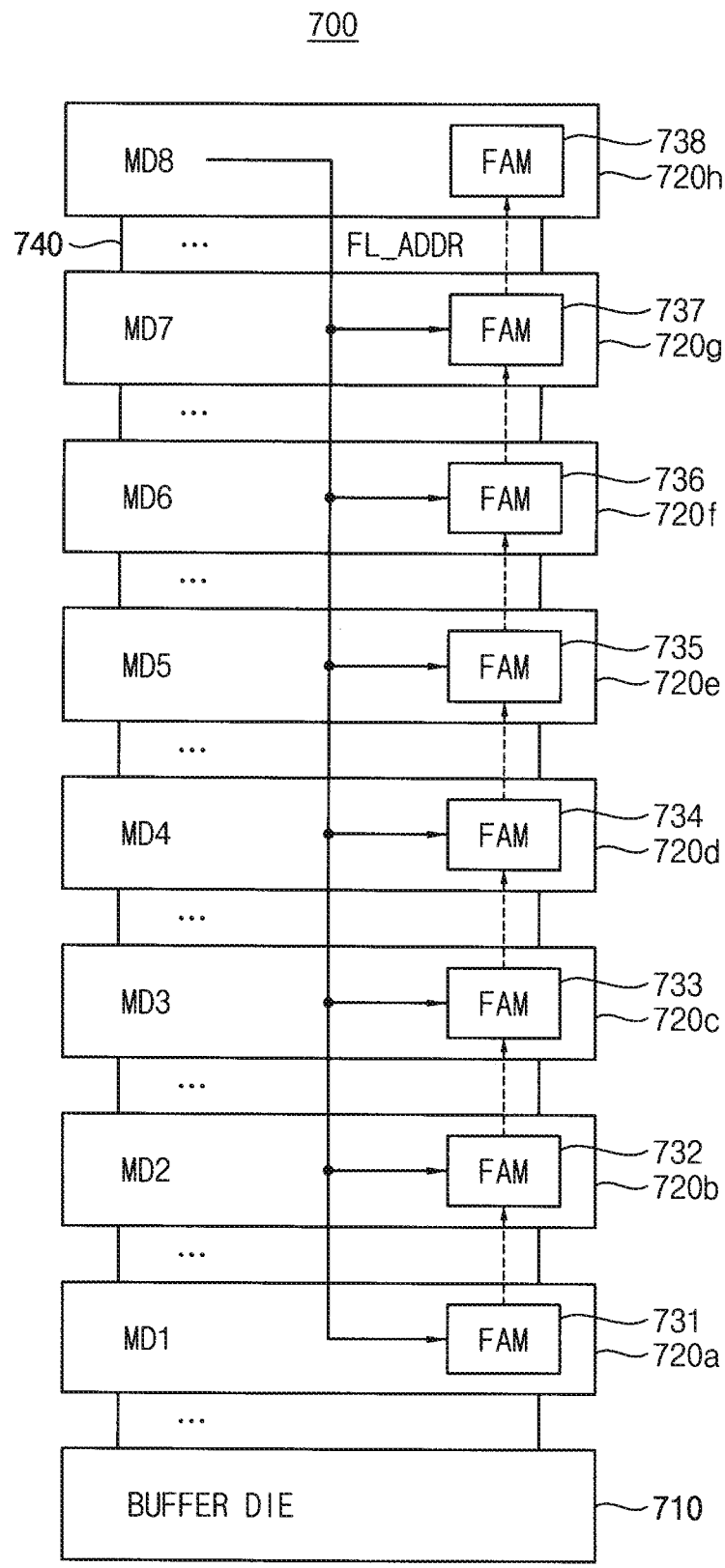
FIG. 18 is a block diagram illustrating an example of a stacked memory device according to at least one example embodiment.

FIG. 18 is a block diagram illustrating an example of a stacked memory device according to at least one example embodiment.

Referring to FIG. 18, a stacked memory device 700 may include a plurality of layers, but is not limited thereto. The stacked memory device 700 may include a buffer die 710 and/or a plurality of memory dies 720a~720h stacked on the buffer die 710, etc. In FIG. 18, for example, first through eighth memory dies 720a~720h are included in the stacked memory device 700, but the number of memory dies included in the stacked memory device 700 may be different in other example embodiments.

The buffer die 710 may communicate with a memory controller (e.g., an external device, etc.), may receive a command, an address, and/or data, etc., from the memory controller and may provide the command, the address, and/or the data, etc., to the memory dies 720a~720h. The buffer die 710 may communicate with the memory controller through conducting means (such as bumps, other electrical connections, etc.) formed on outer surface of the stacked memory device 700. The buffer die 710 may buffer the command, the address, and/or the data, etc., and thus the memory controller may interface with the memory dies 720a~720h by driving only a load of the buffer die 710.

The stacked memory device 700 may include TSVs 740 that penetrate the plurality of layers. The TSVs 740 may be disposed to penetrate the memory dies 720a~720h and each of the memory dies 720a~720h may include a transmitter/a receiver connected to the TSVs 740.

Each of the memory dies 720a~720h may include each of the plurality of fail address memories 731~738 which are implemented with SRAM cells in a column decoder in each of the memory dies 720a~720h, but the example embodiments are not limited thereto.

In a test mode of the stacked memory device 700, a test circuit in the buffer die 710 performs a test on a target memory die corresponding to one of the memory dies 720a~720h and at least one fail address FL_ADDR detected in the target memory die may be stored in at least one fail address memory of other memory dies, except (e.g., not including) the target memory die, through the TSVs 740. When the test on the target memory die is completed, the at least one fail address stored in the at least one fail address memory of other memory dies may be transmitted to the memory controller through data I/O path of the stacked memory device 700. The memory controller may perform PPR on a memory die including the fail address based on the fail address in a normal mode.

In FIG. 18, it is illustrated as the fail address FL_ADDR detected in the memory die 720h is stored in at least one fail address memory of other memory dies 720a~720g.

Figure 19:
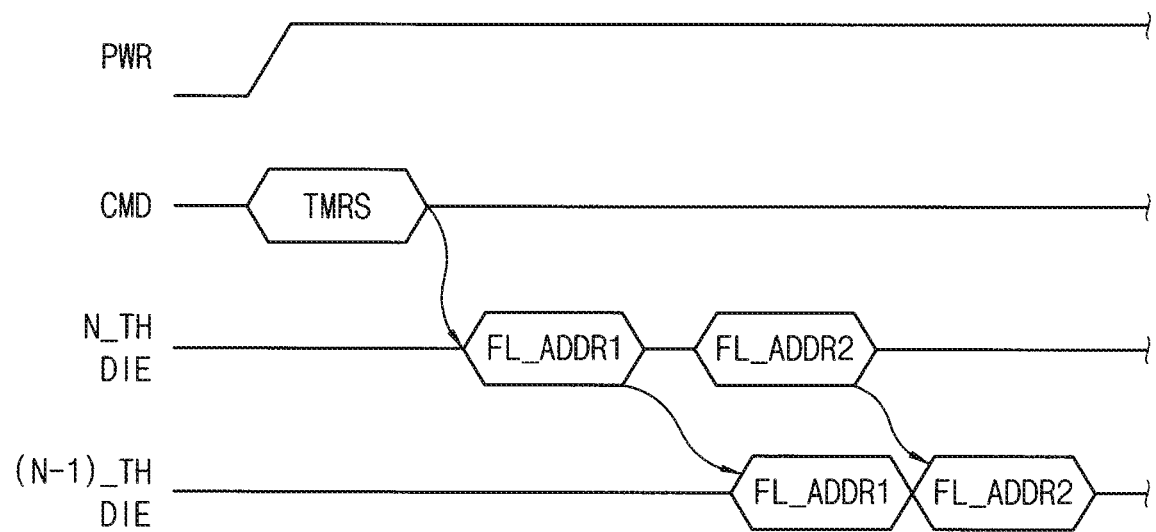
FIG. 19 illustrates movement of fail addresses when a test is performed on the stacked memory device according to at least one example embodiment.

FIG. 19 illustrates movement of fail addresses when a test is performed on the stacked memory device according to at least one example embodiment.

Referring to FIGS. 1, 10 through 15 and 19, when a power PWR is applied to the stacked memory device 70 and the command CMD from the memory controller 20a corresponds to a test command and/or a TMRS signal, etc., the stacked memory device 70 performs a test on N_th memory die (e.g., the target memory die). Fail addresses FL_ADDR1 and FL_ADDR2 are detected in the N-th memory die through the test and the fail addresses FL_ADDR1 and FL_ADDR2 temporarily stored in a column decoder in the N_th memory die. The fail addresses FL_ADDR1 and FL_ADDR2 temporarily stored in the column decoder in the N-th memory die may be stored in a column decoder in the (N−1)_th memory die through TSVs. Therefore, the stacked memory device 70 may increase the amount of storage space available to store fail addresses in the test mode of the stacked memory device 70 over conventional memory devices.

Figure 20:
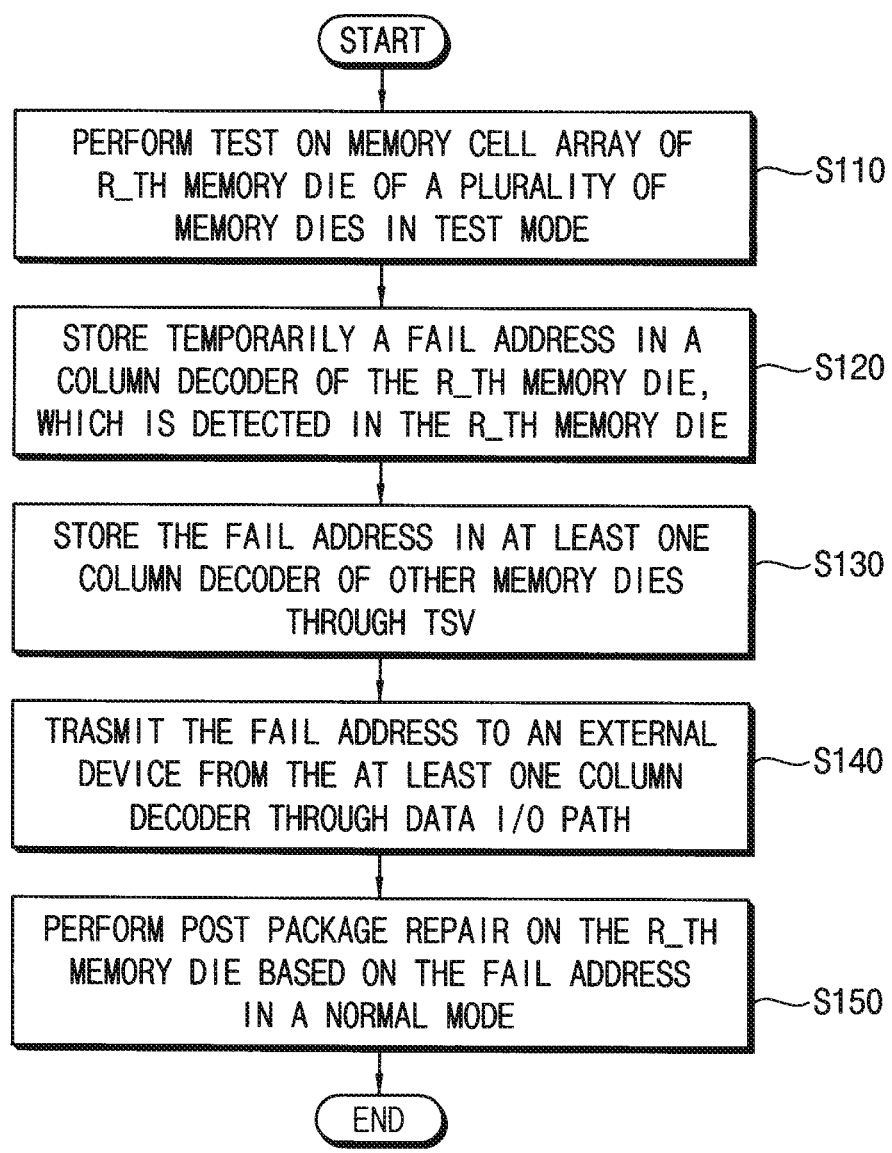
FIG. 20 is a flow chart illustrating a method of operating a stacked memory device according to at least one example embodiment.

FIG. 20 is a flow chart illustrating a method of operating a stacked memory device according to at least one example embodiment.

Referring to FIGS. 1 through 20, in a method of operating a stacked memory device 70 which includes a buffer die 100 that communicates with an external device, a plurality of memory dies 200 stacked on the buffer die 100 and TSVs 130 penetrating through the memory dies 200, a test circuit 110 in the buffer die 100 performs a test one a memory cell array of r_th memory die (e.g., a target memory die) of the memory dies 200 (S110).

When a fail address FL_ADDR is detected in the target memory die, the fail address FL_ADDR is temporarily stored in a column decoder of the target memory die (S120).

The fail address FL_ADDR is stored in a column decoder in a column decoder in at least one of other memory dies, except (e.g., not including) the target memory die, through the TSVs 130 (S130).

The fail address FL_ADDR is transmitted to the external device from the at least one column decoder through a data I/O path of the stacked memory device 70 (S150).

The external device performs a PPR on the target memory die based on the fail address FL_ADDR.

Figure 21:
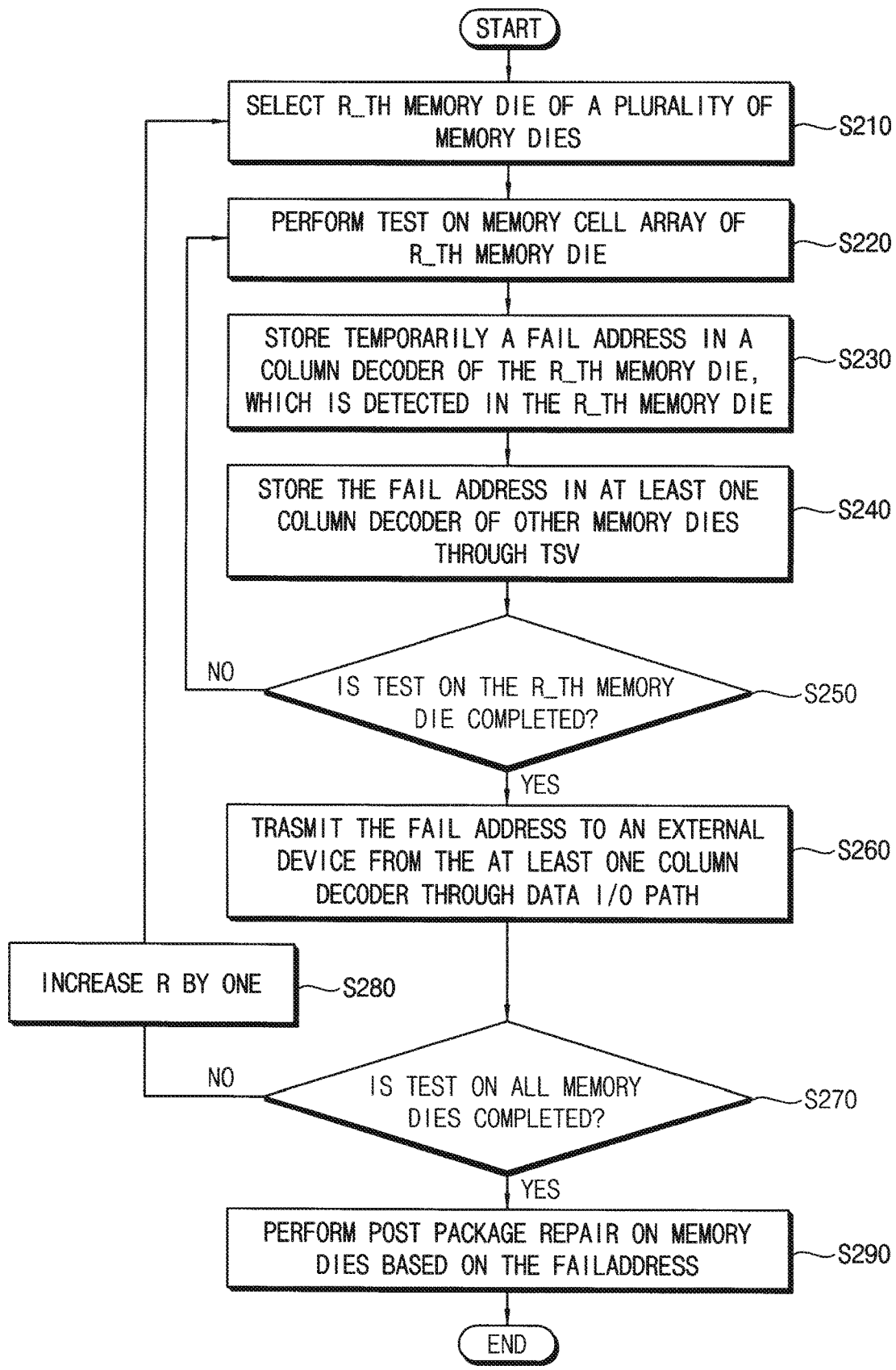
FIG. 21 is a flow chart illustrating a method of operating a stacked memory device according to at least one example embodiment.

FIG. 21 is a flow chart illustrating a method of operating a stacked memory device according to at least one example embodiment.

Referring to FIGS. 1 through 19 and 21, in a method of operating a stacked memory device 70 which includes a buffer die 100 that communicates with, for example, at least one external device, etc., a plurality of memory dies 200 stacked on the buffer die 100 and TSVs 130 penetrating through the memory dies 200, a r_th memory die (a target memory die) is selected of the memory dies 200 (S210).

A test circuit 110 in the buffer die 100 performs a test on at least one memory cell array of the target memory die (S220). When a fail address FL_ADDR is detected in the target memory die, the fail address FL_ADDR is temporarily stored in a column decoder of the target memory die (S230).

The fail address FL_ADDR is stored in a column decoder in a column decoder in at least one of the other memory dies, not including the target memory die, through the TSVs 130 (S240).

The test circuit 110 determines whether the test on the target memory die is completed (S250). When the test on the target memory die is not completed (NO in S250), the process returns to the S220 operation. When the test on the target memory die is completed (YES in S250), the fail address FL_ADDR is transmitted to, for example, the external device from the at least one column decoder through a data I/O path of the stacked memory device 70 (S260).

The test circuit 110 determines whether the test is completed on all memory dies (S270). When the test is not completed on all memory dies (NO in S270), r is increased by one (S280) and the process returns to the S210 operation.

When the test is completed on all memory dies (NO in S270), the external device performs the PPR on the stacked memory device 70 based on the fail address FL_ADDR.

Accordingly, the stacked memory device including a plurality of memory dies may store fail addresses in column decoders of other memory dies through TSVs in a test mode. Therefore, the stacked memory device according to at least one example embodiment may increase the amount of storage space available to store the fail addresses.

Figure 22:
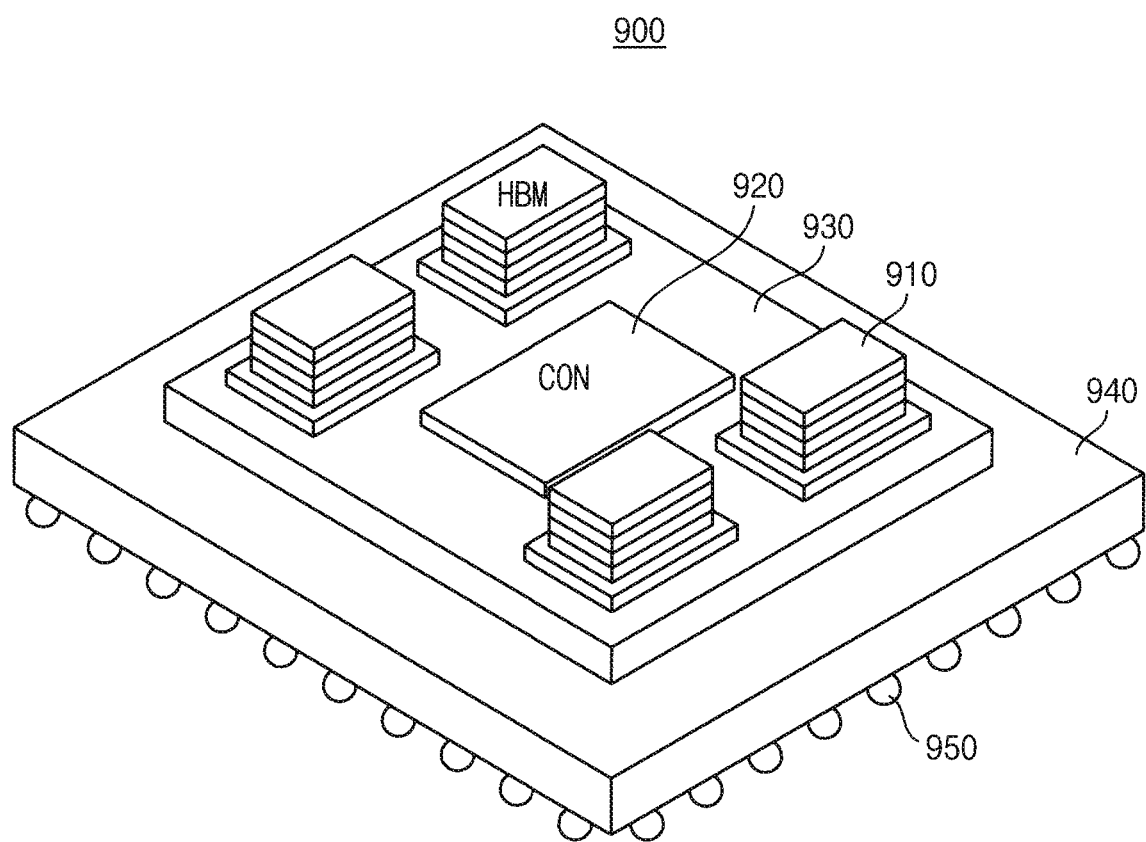
FIG. 22 is a configuration diagram illustrating a semiconductor package including the stacked memory device according to at least one example embodiment.

FIG. 22 is a configuration diagram illustrating a semiconductor package including the stacked memory device according to at least one example embodiment.

Referring to FIG. 22, a semiconductor package 900 may include one or more stacked memory devices 910 and/or a memory controller 920, etc., but the example embodiments are not limited thereto.

The stacked memory devices 910 and/or memory controller 920 may be mounted on an interposer 930, and the interposer on which the stacked memory device 910 and/or memory controller 920 are mounted may be mounted on a package substrate 940, but the example embodiments are not limited thereto.

The memory controller 920 may correspond to a semiconductor device which may perform a memory control function, and for example, memory controller 920 may be implemented as an application processor (AP).

The stacked memory device 910 may be implemented in various forms, and the stacked memory device 910 may be a memory device in an high bandwidth memory (HBM) form in which a plurality of layers are stacked.

Accordingly, the stacked memory device 910 may include a buffer die and a plurality of memory dies and may store fail addresses detected in a target memory die in column decoders of other memory dies, instead of the target memory die and/or not including the target memory die, in a test mode. Therefore, the stacked memory device 910 may increase the amount of storage space available to store the fail addresses and thus may increase the usability of the stacked memory device 910 in the test mode.

The plurality of stacked memory devices 910 may be mounted on the interposer, and memory controller 920 may communicate with the plurality of stacked memory devices 910.

For example, each of the stacked memory devices 910 and memory controller 920 may include a physical region, and communication may be performed between the stacked memory devices 910 and memory controller 920 through the physical regions. Meanwhile, when the stacked memory device 910 includes a direct access region, a test signal may be provided into the stacked memory device 910 through conductive means (e.g., solder balls 950, bumps, etc.) mounted under package substrate 940 and the direct access region.

Here, the interposer 930 may include an embedded multi-die interconnect bridge (EMIB) which is an organic or non-TSV manner having a TSV form or a printed circuit board (PCB) form, but the example embodiments are not limited thereto.

Various aspects of at least one example embodiment of the present inventive concepts may be applied to the testing of stacked memory devices.

The foregoing is illustrative of various example embodiments and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims.

What is claimed is:

1. A stacked memory device comprising:
   a buffer die configured to communicate with at least one external device, the buffer die including a test circuit;
   a plurality of memory dies stacked on the buffer die, each of the plurality of memory dies including a memory cell array, the memory cell array including a plurality of dynamic memory cells coupled to a plurality of word-lines and a plurality of bit-lines;
   a plurality of through silicon vias (TSVs) extending through the plurality of memory dies and connected to the buffer die; and
   the test circuit, during a test mode of the stacked memory device, is configured to, perform a test on the dynamic memory cells of a target memory die corresponding to at least one of the plurality of memory dies, the test to detect at least one defective cell of the target memory die, and store, as fail address information, an address of a memory cell row including the at least one defective cell detected through the test, in at least one column decoder of another memory die of the plurality of memory dies, the another memory die not being the target memory die.

2. The stacked memory device of claim 1, wherein each of the plurality of memory dies further includes:

a row decoder coupled to the memory cell array through the plurality of word-lines; and a column decoder coupled to the memory cell array through the plurality of bit-lines.

3. The stacked memory device of claim 2, wherein the column decoder in each of the plurality of memory dies is configured to store anti-fuse information associated with a repair operation of the memory cell array during a normal mode of the memory die; and the column decoder in at least one of the another memory die of the plurality of memory dies is configured to store the fail address information during the test mode.

4. The stacked memory device of claim 3, wherein the column decoder is configured to store a plurality of bits of the fail address information during the test mode.

5. The stacked memory device of claim 3, wherein, during the test mode, the test circuit is configured to:

write test pattern data in a target memory cell row of the target memory die;

receive test result data corresponding to the test pattern data from the target memory die; and determine whether the target memory cell row includes the at least one defective cell based on the test pattern data and the test result data.

6. The stacked memory device of claim 5, wherein:

the test circuit is configured to apply a fail flag signal to a row decoder of the target memory die in response to the target memory cell row including the at least one defective cell, the fail flag signal indicating that the target memory cell row includes the at least one defective cell; and the row decoder of the target memory die is configured to transmit the fail address information to the column decoder of the target memory die in response to the fail flag signal.

7. The stacked memory device of claim 5, wherein the row decoder is further configured to:

generate an oscillator enable signal and a latch output enable signal in response to a fail flag signal;

output a clock signal that oscillates in response to the oscillator enable signal;

divide the clock signal to generate a first clock signal and a second clock signal;

latch a row address of the target memory cell row; and serialize the latched row addresses in response to the first clock signal and the second clock signal providing the fail address information.

8. The stacked memory device of claim 3, wherein each of the plurality of column decoders is further configured to:

receive the fail address information; and output a fail address corresponding to the fail address information.

9. The stacked memory device of claim 1, wherein the test circuit is configured to control the another memory die of the plurality of memory dies to output a fail address stored in the at least one column decoder of the another memory die through a data input/output path of the stacked memory device in response to the test being completed on the target memory die.

10. The stacked memory device of claim 9, wherein the test circuit is configured to:

sequentially perform the test on each of the plurality of the memory dies; and control the plurality of memory dies to output the fail address stored in the at least one column decoder of the another memory die through a data input/output path of the stacked memory device in response to the test being completed on each of the plurality of memory dies.

11. The stacked memory device of claim 10, wherein:

the test circuit is configured to transmit, to the external device, fail addresses corresponding to fail address information associated with each of the plurality of memory dies; and the external device is configured to perform a post package repair (PPR) on defective cells of each of the plurality of memory dies based on the fail addresses of the plurality of memory dies.

12. The stacked memory device of claim 1, wherein the buffer die includes:

an internal command generator configured to receive a command from the external device, generate at least two internal commands based on the received command, and transfer the at least two internal commands to the plurality of memory dies through a command TSV individually connected to each of the plurality of memory dies; and the test circuit, the test circuit being further configured to transfer test pattern data to the plurality of memory dies through a data TSV commonly connected to each of the plurality of memory dies.

13. The stacked memory device of claim 12, wherein the buffer die includes:

a physical region configured to interface with the external device;

a TSV region in which the command TSV and the data TSV are formed; and a direct access region, the direct access region including the test circuit and a bus to communicate directly with an external test device.

14. The stacked memory device of claim 13, wherein:

the physical region is disposed adjacent to the TSV region; and the direct access region is disposed adjacent to the physical region.

15. The stacked memory device of claim 13, wherein the internal command generator is disposed in the direct access region.

16. The stacked memory device of claim 12, wherein the internal command generator is configured to control the test circuit to sequentially perform the test on the plurality of memory dies in response to the received command corresponding to a test command or a test mode register set (TMRS).

17. A memory system comprising:

a memory controller configured to control a stacked memory device; and the stacked memory device, the stacked memory device including, a buffer die configured to communicate with the memory controller, the buffer die including a test circuit;

a plurality of memory dies stacked on the buffer die, each of the plurality of memory dies including a memory cell array, the memory cell array including a plurality of dynamic memory cells coupled to a plurality of word-lines and a plurality of bit-lines; and a plurality of through silicon vias (TSVs) extending through the plurality of memory dies to connect to the buffer die; and the test circuit, during a test mode of the stacked memory device is configured to in response to test command or a test mode register set (TMRS) from the memory controller, perform a test on the dynamic memory cells of a target memory die corresponding to at least one of the plurality of memory dies, the test to detect at least one defective cell of the target memory die, and store, as fail address information, an address of a memory cell row including the at least one defective cell detected through the test, in at least one column decoder of another memory die of the plurality of memory dies, the another memory die not being the target memory die.

18. The memory system of claim 17, wherein each of the plurality of memory dies further includes:

a row decoder coupled to the memory cell array through the plurality of word-lines; and a column decoder coupled to the memory cell array through the plurality of bit-lines, wherein the column decoder in each of the plurality of memory dies are each configured to:

store anti-fuse information associated with a repair operation of the memory cell array in a normal mode of the memory die, and the column decoder in at least one other memory dies of the plurality of memory dies is configured to store the fail address information during the test mode.

19. A method of operating a stacked memory device, the stacked memory device including a buffer die that communicates with at least one external device, a plurality of memory dies stacked on the buffer die, and a plurality of through silicon vias (TSVs) extending through the plurality of memory dies to connect to the buffer die, the method comprising:

performing a test on dynamic memory cells of a target memory die corresponding to one of the plurality of memory dies, the test to detect at least one defective cell of the target memory die;

temporarily storing a fail address in a column decoder of the target memory die based on results of the test of the target memory die;

storing the fail address in at least one column decoder of another memory die of the plurality of memory dies, the another memory die not being the target memory die; and transmitting the fail address to the external device from the at least one column decoder of the another memory die through a data input/output path of the stacked memory device.

20. The method of claim 19, further comprising:

performing a post package repair (PPR) on the target memory die based on the fail address during a normal mode of the stacked memory device.

* * * * *